(12) United States Patent
Yaegashi

(10) Patent No.: US 7,232,764 B1
(45) Date of Patent: Jun. 19, 2007

(54) SEMICONDUCTOR DEVICE FABRICATION METHOD

(75) Inventor: Tetsuo Yaegashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/366,510

(22) Filed: Mar. 3, 2006

(30) Foreign Application Priority Data

Dec. 9, 2005 (JP) ............................. 2005-355683

(51) Int. Cl.
*H01L 21/311* (2006.01)

(52) U.S. Cl. ...................................... 438/702; 438/703

(58) Field of Classification Search ................ 438/700, 438/702, 703, 706, 719, 723, 724
See application file for complete search history.

(56) References Cited

U.S. PATENT DOCUMENTS

| | | | |
|---|---|---|---|
| 5,960,252 A * | 9/1999 | Matsuki et al. ................. | 438/3 |
| 5,990,513 A | 11/1999 | Perino et al. | |
| 6,548,343 B1 * | 4/2003 | Summerfelt et al. ......... | 438/240 |
| 6,649,468 B2 * | 11/2003 | Schindler et al. ............ | 438/253 |
| 6,781,184 B2 * | 8/2004 | Solayappan et al. ........ | 257/310 |
| 2002/0061620 A1 * | 5/2002 | Hikosaka et al. ............ | 438/240 |
| 2003/0132472 A1 * | 7/2003 | Koizumi ...................... | 257/296 |
| 2006/0220081 A1 * | 10/2006 | Nagai et al. ................. | 257/295 |

FOREIGN PATENT DOCUMENTS

| | | |
|---|---|---|
| JP | 10-144681 | 5/1998 |
| JP | 2002-76296 | 3/2002 |
| JP | 2003-152165 | 5/2003 |
| JP | 2003-158247 | 5/2003 |
| JP | 2003-273325 | 9/2003 |
| JP | 2004-23086 | 1/2004 |
| JP | 2004-153031 | 5/2004 |
| JP | 2004-303995 | 10/2004 |
| JP | 2004-320063 | 11/2004 |
| JP | 2005-217044 | 8/2005 |

* cited by examiner

*Primary Examiner*—Kin-Chan Chen
(74) *Attorney, Agent, or Firm*—Westerman, Hattori, Daniels & Adrian, LLP.

(57) ABSTRACT

The semiconductor device fabrication method comprises the step of forming a first insulation film 48 on a semiconductor substrate 10 and a ferroelectric capacitor 42; the step of forming first interconnections 56a–56c; the step of forming a second insulation film 60; the step of planarizing the surface of the second insulation film 60; the step of making heat treatment with a heat treatment furnace to remove water from the second insulation film 60; the step of making heat treatment in a plasma atmosphere generated by using $N_2O$ gas or $N_2$ gas; the step of removing water from the second insulation film 60 and nitriding the surface of the second insulation film 60; the step of forming a barrier film 62 on the second insulation film 60; the step of forming contact holes 68 in the barrier film 62 and the second insulation film 60; and the step of burying conductor plugs 70 in the contact holes 68.

18 Claims, 17 Drawing Sheets

SEMICONDUCTOR DEVICE FABRICATION METHOD

CROSS-REFERENCE TO RELATED APPLICATION

This application is based upon and claims priority of Japanese Patent Application No. 2005-355683, filed on Dec. 9, 2005, the contents being incorporated herein by reference.

BACKGROUND OF THE INVENTION

The present invention relates to a method for fabricating semiconductor device, more specifically, a method for fabricating a semiconductor device including ferroelectric capacitors.

Recently, the use of ferroelectric film as the dielectric films of the capacitors is noted. The FeRAM (Ferroelectric Random Access Memory) using such ferroelectric capacitor can operate at high operating speed and has low electric power consumption. The FeRAM is a non-volatile memory characterized by good write/read durability, etc. and prospects for further development.

However, the ferroelectric capacitor has a characteristic that the characteristics are easily deteriorated by hydrogen gas or water from the outside. Specifically, for the ferroelectric capacitor of a standard FeRAM, having the lower electrode of Pt film, the ferroelectric film of PZT film and the upper electrode of Pt film sequentially stacked, it is known that when the substrate is heated to a temperature of about 200° C. in an atmosphere of an about 40 Pa (0.3 Torr) hydrogen partial pressure, the $PbZr_{1-x}Ti_xO_3$ film (PZT film) substantially loses the ferroelectricity. It is known that when the substrate is subjected to heat treatment with the ferroelectric capacitor adsorbing sufficiently water or with water being present near the ferroelectric capacitor, the ferroelectricity of the ferroelectric film of the ferroelectric capacitor is much deteriorated.

Because of this characteristic of the ferroelectric capacitor, in the FeRAM fabrication process, a process which generates water as little as possible and is made at low temperatures is selected as the process following the formation of the ferroelectric film. As the process for forming the inter-layer insulation film, a film forming process by CVD (Chemical Vapor Deposition) or others using a raw material gas which generates a relatively small amount of hydrogen is selected.

Furthermore, as the technique for preventing the deterioration of the ferroelectric film by hydrogen or water are proposed the technique of forming a barrier film of aluminum oxide film covering the ferroelectric capacitor and the technique of forming a barrier film of aluminum oxide film on an inter-layer insulation film formed on the ferroelectric capacitor. The barrier film of aluminum oxide, film has the function of preventing the diffusion of hydrogen or water. Accordingly, the proposed techniques can prohibit hydrogen or water from arriving at the ferroelectric film and prevent the deterioration of the ferroelectric film due to the hydrogen or water.

However, the barrier film simply formed on an inter-layer insulation film having steps in the surface does not have good coverage and cannot sufficiently prevent the diffusion of hydrogen or water. When hydrogen or water arrives at the ferroelectric film of the ferroelectric capacitor, the metal oxide forming the ferroelectric film is reduced with the hydrogen, and the electric characteristics of the ferroelectric capacitor are deteriorated.

Then, a technique of planarizing the surface of the inter-layer insulation film and forming the barrier film on the planarized inter-layer insulation film is proposed. The flat barrier film has very good coverage and can surely prevent the diffusion of hydrogen or water.

Following references disclose the background art of the present invention.

[Patent Reference 1]
Specification of Japanese Patent Application Unexamined Publication No. 2005-217044
[Patent Reference 2]
Specification of Japanese Patent Application Unexamined Publication No. 2003-152165
[Patent Reference 3]
Specification of Japanese Patent Application Unexamined Publication No. 2004-23086
[Patent Reference 4]
Specification of Japanese Patent Application Unexamined Publication No. 2004-153031
[Patent Reference 5]
Specification of Japanese Patent Application Unexamined Publication No. 2002-76296
[Patent Reference 6]
Specification of Japanese Patent Application Unexamined Publication No. Hei 10-144681
[Patent Reference 7]
Specification of Japanese Patent Application Unexamined Publication No. 2003-158247
[Patent Reference 8]
Specification of Japanese Patent Application Unexamined Publication No. 2004-303995
[Patent Reference 9]
Specification of Japanese Patent Application Unexamined Publication No. 2004-320063
[Patent Reference 10]
Specification of Japanese Patent Application Unexamined Publication No. 2003-273325

However, when the flat barrier film is formed on the inter-layer insulation film, the conductor plugs buried in the inter-layer insulation film are not formed well, and the fabrication yield is often lowered.

SUMMARY OF THE INVENTION

An object of the present invention is to provide a method for fabricating a semiconductor device, which can form conductor plugs well even with a flat barrier film formed on an inter-layer insulation film.

According to one aspect of the present invention, the present invention provides a semiconductor device fabrication method comprising the steps of: forming over a semiconductor substrate a ferroelectric capacitor including a lower electrode, a ferroelectric film formed over the lower electrode, and a upper electrode formed over the ferroelectric film; forming a first insulation film over the semiconductor substrate and the ferroelectric capacitor; forming a first interconnection over the first insulation film; forming a second insulation film over the first insulation film and the first interconnection; planarizing a surface of the second insulation film; making heat treatment with a heat treatment furnace to remove water from the second insulation film; making heat treatment in a plasma atmosphere generated by using $N_2O$ gas or $N_2$ gas to remove water from the second insulation film and nitride the surface of the second insulation film; forming over the second insulation film a first flat barrier film for preventing the diffusion of hydrogen or water; forming a first contact hole in the first barrier film and the second insulation film down to the first interconnection; and burying a first conductor plug in the first contact hole.

According to the present invention, after the inter-layer insulation film has been formed, the heat treatment with a heat treatment furnace, and the heat treatment in a plasma atmosphere generated by using $N_2O$ gas or $N_2$ gas are made, whereby water can be sufficiently removed from the inter-layer insulation film without excessively damaging the ferroelectric capacitors. According to the present invention, the water in the inter-layer insulation film can be sufficiently removed before the flat barrier film is formed, whereby when conductor plugs are buried in contact holes in a later step, a large amount of water is not released from the inter-layer insulation film via the contact holes. A large amount of water is not released from the inter-layer insulation film via the contact holes when the conductor plugs are buried in the contact holes, which permits the raw material gas forming the conductor plugs to sufficiently arrive at the insides of the contact holes. Thus, according to the present invention, conductor plugs can be buried surely in contact holes, and a semiconductor device of high reliability can be provided.

DETAILED DESCRIPTION OF THE INVENTION

Principle of the Invention

The flat barrier film has good coverage and is superior in the function of blocking water, etc. When a flat barrier film is formed on an inter-layer insulation film with some water remaining in the inter-layer insulation film, and then heat is applied to the inter-layer insulation film, the release of the water from the inter-layer insulation film is obstructed by the barrier film. The heat is applied to the inter-layer insulation film with contact holes formed in the inter-layer insulation film and the barrier film, the water in the inter-layer insulation film is released in a large amount via the contact holes. When conductor plugs are buried in the contact holes by CVD, heat is applied to the inter-layer insulation film, and the water in the inter-layer insulation film is released in a large amount via the contact holes. A large amount of the water, in the inter-layer insulation film is released via the contact holes when the conductor plugs are buried obstructs the arrival of the raw material gas forming the conductor plugs at the insides of the contact holes. Then, the conductor plugs in the contact holes are not formed well, which lowers the reliability.

The water in the inter-layer insulation film can be sufficiently removed by a long time heat treatment in a plasma atmosphere generated by using $N_2O$ gas or others. The long time heat treatment in a plasma atmosphere generated by using $N_2O$ gas or others much damages the ferroelectric capacitors, and the ferroelectric capacitors cannot have good electric characteristics.

The inventor of the present application made earnest studies and has had an idea of sufficiently removing water from an insulation film without excessively damaging the ferroelectric capacitors by combining heat treatment with a heat treatment furnace and heat treatment in a plasma atmosphere generated by using $N_2O$ gas or $N_2$ gas.

Figure 1:
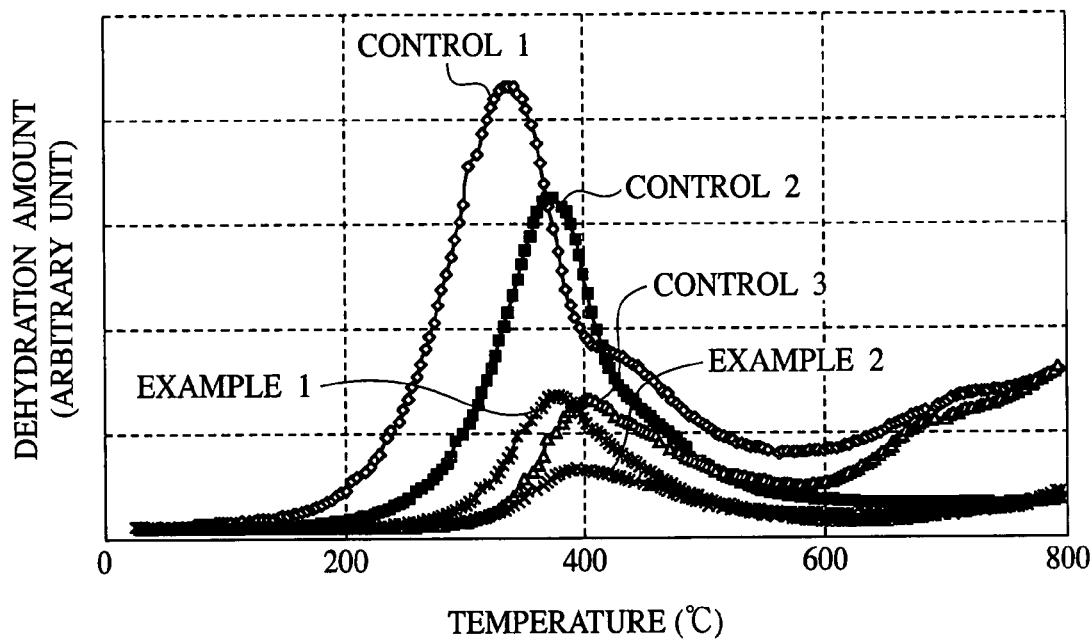
FIG. 1 is a graph of amount of water remaining in silicon oxide films measured by TDS (Thermal Desorption Spectroscopy).

FIG. 1 is a graph of the water amount remaining in a silicon oxide film measured by TDS (Thermal Desorption Spectroscopy).

The TDS heats a sample in a vacuum to raise the temperature and detects with a mass spectrograph the gaseous component released from the sample during the heating.

In FIG. 1, the substrate temperature in the spectroscopy by the TDS is taken on the horizontal axis, and on the vertical axis, the amount of water desorbed from the samples (the dehydration amount) in the measurement by the TDS is taken.

In Control 1, the measurement was made on a sample which has been prepared by forming a silicon oxide film formed on a silicon substrate and making no heat treatment thereafter.

In Control 2, the measurement was made on a sample which has been prepared by forming a silicon oxide film on a silicon substrate and thereafter making heat treatment at 650° C. for 60 minutes in a heat treatment furnace.

In Control 3, the measurement was made on a sample which has been prepared by forming a silicon oxide film on a silicon substrate and thereafter making heat treatment for 2 minutes in a plasma atmosphere generated by using $N_2O$ gas.

In Example 1, the measurement was made on a sample which has been prepared by forming a silicon oxide film on a silicon substrate, and thereafter making heat treatment at 650° C. for 60 minutes in a heat treatment furnace and additionally making heat treatment for 2 minutes in a plasma atmosphere generated by using $N_2O$ gas.

In Example 2, the measurement was made on a sample which has been prepared by forming a silicon oxide film on a silicon substrate, and thereafter making heat treatment for 2 minutes in a plasma atmosphere generated by using $N_2O$ and additionally making heat treatment at 650° C. for 60 minutes.

Figure 2:
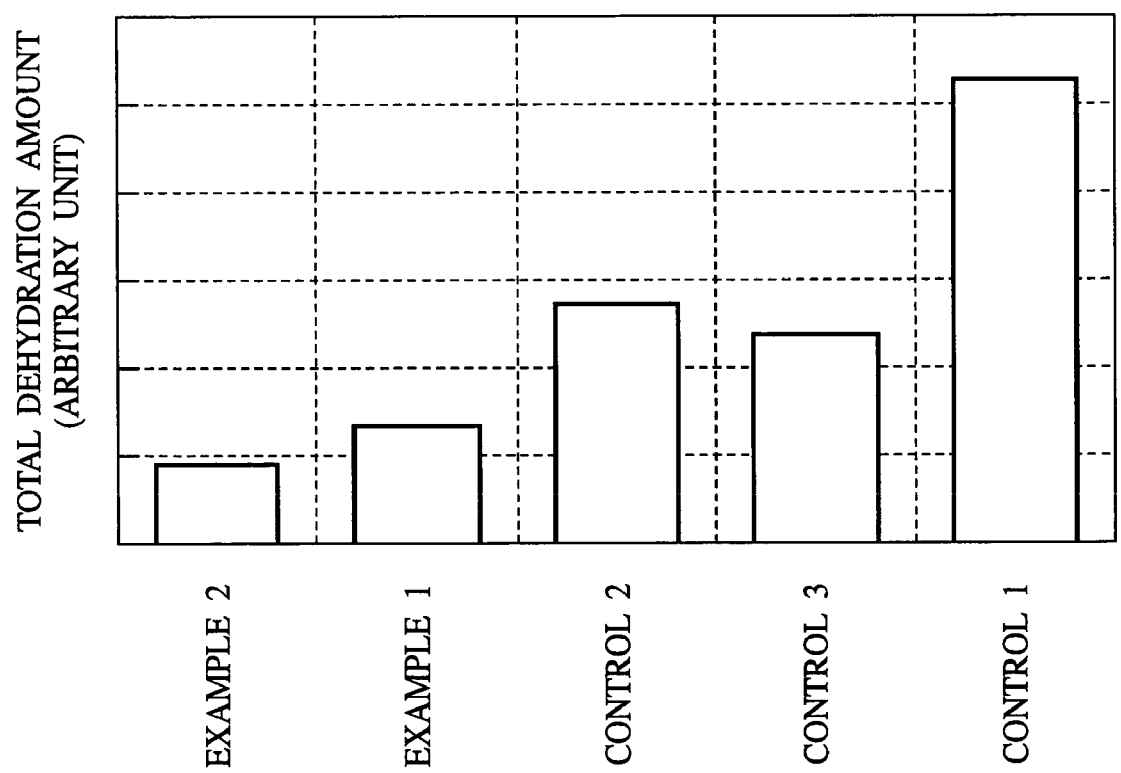
FIG. 2 is a graph of the total dehydration amounts given based on the measured result of the TDS.

FIG. 2 is a graph of the total dehydration amounts given based on the measured results by the TDS.

As evident in FIGS. 1 and 2, in Control 1, the dehydration amount of the sample is large. This means that when no heat treatment is made, much water remains in the silicon oxide film.

In Control 2, the dehydration amount is smaller than in Control 1. This means that when the heat treatment is made in a heat treatment furnace, the water in the silicon oxide film can be removed to some extant. However, in Control 2 as well, a considerable amount of water remains in the silicon oxide film, and it cannot be said that the water remaining in the silicon oxide film can be sufficiently removed.

In Control 3, the dehydration amount is further smaller in comparison with that of Control 2. This means that the heat treatment in a plasma atmosphere generated by using $N_2O$ gas or $N_2$ gas can remove a larger amount of the water in the silicon oxide film.

In Example 1, the dehydration amount is smaller than in Control 3. This means that the water in the silicon oxide film can be removed in a larger amount by combing the heat treatment in a plasma atmosphere generated by using $N_2O$ gas and the heat treatment using a heat treatment furnace.

In Example 2, the dehydration amount is further smaller than in Example 1. This means that the water in the silicon oxide film can be removed in a larger amount by making the heat treatment in a plasma atmosphere generated by using $N_2O$ gas following the heat treatment with a heat treatment furnace.

Based on the measured result, the inventor of the present application made earnest studies and has had an idea that the heat treatment in a plasma atmosphere generated by using $N_2O$ gas is made after the heat treatment with a heat treatment furnace, whereby the water in the inter-layer insulation film can be sufficiently removed.

Furthermore, the inventor of the present application has had an idea that the heat treatment in a plasma atmosphere generated by using $N_2O$ gas or $N_2$ gas following the heat treatment with a heat treatment furnace can further sufficiently remove the water in the inter-layer insulation film.

The reason why the water in the silicon oxide film can be removed in a larger amount by making the heat treatment in a plasma atmosphere generated by using $N_2O$ gas following the heat treatment with a heat treatment furnace than by making the heat treatment with a heat treatment furnace following the heat treatment in a plasma processing of $N_2O$ gas will be as follows.

That is, the heat treatment in a plasma atmosphere generated by using $N_2O$ gas removes the water in the silicon oxide film while nitriding the surface of the silicon oxide film to form silicon nitride oxide film on the surface of the silicon oxide film. The silicon nitride oxide film prevents the intrusion of water into the silicon oxide film from the outside while preventing the release of the water in the silicon oxide film to the outside. That is, when the heat treatment with a heat treatment furnace is made after the heat treatment in a plasma atmosphere generated by using $N_2O$ gas, silicon oxide nitride film is formed on the surface of the silicon oxide film in the stage where the water in the silicon oxide film has not been sufficiently removed, and the silicon nitride oxide film blocks the release of the water from the silicon oxide film in the heat treatment with a heat treatment furnace. Accordingly, in the silicon oxide film, the water remains in a larger amount when the heat treatment with a heat treatment furnace is followed by the heat treatment in a plasma atmosphere generated by using $N_2O$ gas than when the heat treatment in a plasma atmosphere generated by using $N_2O$ gas is followed the heat treatment with a heat treatment furnace.

This will be a reason for the water in the inter-layer insulation film being able to be removed in a larger amount by the heat treatment in a plasma atmosphere generated by using $N_2O$ gas following the heat treatment in a heat treatment than by the heat treatment with a heat treatment furnace following the heat treatment in a plasma atmosphere generated by using $N_2O$ gas.

The use of a plasma atmosphere generated by using $N_2$ gas in place of a plasma atmosphere generated by using $N_2O$ gas will give the same result.

As described above, according to the present invention, an inter-layer insulation film is formed, and then the heat treatment with a heat treatment furnace and the heat treatment in a plasma atmosphere generated by using $N_2O$ gas or $N_2$ gas are made, whereby the water in the inter-layer insulation film can be sufficiently removed without excessively damaging the ferroelectric capacitors. According to the present invention, the water in the inter-layer insulation film can be sufficiently removed before a flat barrier film is formed, whereby when conductor plugs are buried in contact holes in a later step, the water in the inter-layer insulation film is prevented from being released in a large amount via the contact holes. When the conductor plugs are buried in the contact holes, the water in the inter-layer insulation film is not released in a large amount via the contact holes, which allows the raw material gas forming the conductor plugs to sufficiently arrive at the insides of the contact holes. Thus, according to the present invention, the conductor plugs can be surely buried in the contact holes, and a semiconductor device of high reliability can be provided.

AN EMBODIMENT

The method for fabricating a semiconductor device according to an embodiment of the present invention will be explained with reference to FIGS. 3 to 17B.

(Semiconductor Device)

Figure 3:
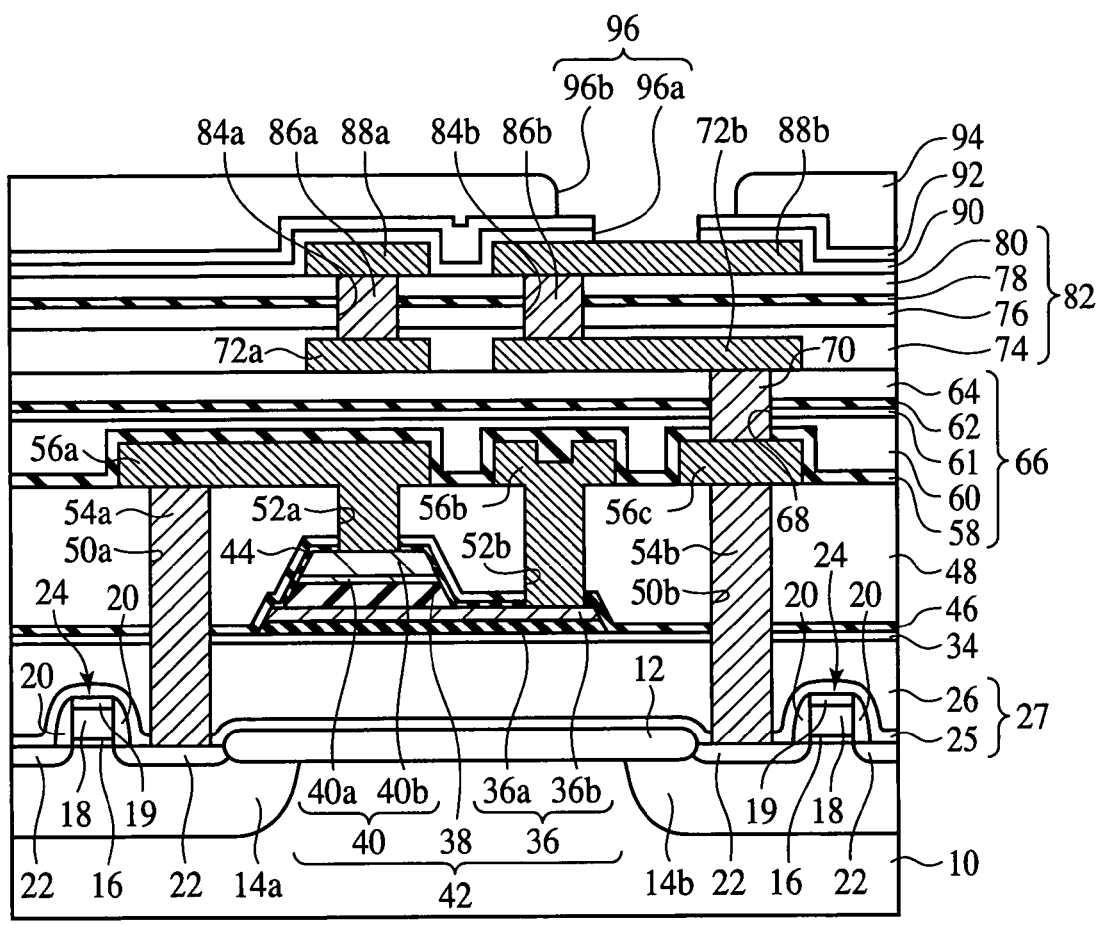
FIG. 3 is a sectional view of the semiconductor device according to one embodiment of the present invention.

First, the structure of the semiconductor device according to the present embodiment will be explained with reference to FIG. 3. FIG. 3 is a sectional view of the semiconductor device according to the present embodiment.

As illustrated in FIG. 3, device isolation regions 12 for defining device regions are formed on a semiconductor substrate 10 of, e.g., silicon. Wells 14a, 14b are formed in the semiconductor substrate 10 with the device isolation regions 12 formed in.

On the semiconductor substrate 10 with the wells 14a, 14b formed in, gate electrodes (gate lines) 18 are formed with a gate insulation film 16 formed therebetween. The gate electrodes 18 have the polycide structure of a metal silicide film, such as tungsten silicide film or others, formed on a polysilicon film. An insulation film 19 of silicon oxide film is formed on the gate electrodes 18. A sidewall insulation film 20 is formed on the side walls of the gate electrodes 18 and the insulation film 19.

On both sides of the gate electrodes 18 with the sidewall insulation film 20 formed on, a source/drain diffused layer 22 is formed. Thus, transistors 24 each having the gate electrode 18 and the source/drain diffused layer 22 are constituted. The gate length of the transistors 24 is set at, e.g., 0.35 µm or, e.g., 0.11–0.18 µm.

On the semiconductor substrate 10 with the transistors 24 formed on, a 200 nm-thickness SiON film 26, for example, and a 600 nm-thickness silicon oxide film 26, for example, are sequentially laid. Thus, an inter-layer insulation film 27 of the SiON film 25 and the silicon oxide film 26 sequentially laid is formed. The surface of the inter-layer insulation film 27 is planarized.

A 100 nm-thickness silicon oxide film 34, for example, is formed on the inter-layer insulation film 27. The silicon oxide film 34, which is formed on the planarized inter-layer insulation film 27, is flat.

On the silicon oxide film 34, the lower electrodes 36 of ferroelectric capacitors 42 are formed. The lower electrodes 36 are formed of the layer film of a 20–50 nm-thickness aluminum oxide film 36a and a 100–200 nm-thickness Pt film 36b, for example, sequentially laid. The film thickness of the Pt film 36b is set at 165 nm.

On the lower electrodes 36, a ferroelectric film 38 of the ferroelectric capacitors 42 is formed. The ferroelectric film 38 is, e.g., a 100–250 nm-thickness $PbZr_{1-x}Ti_xO_3$ film (PZT film) is formed. The ferroelectric film 38 is a 150 nm-thickness PZT film.

On the ferroelectric film 38, the upper electrodes 40 of the ferroelectric capacitors 42 are formed. The upper electrodes 40 are formed of the layer film of a 25–75 nm-thickness $IrO_X$ film 40a and a 150–250 nm-thickness $IrO_Y$ film 40b sequentially laid. The film thickness of the $IrO_X$ film 40a is set at 50 nm here, and the film thickness of the $IrO_Y$ film 40b is set at 200 nm here. The composition ratio of oxygen of the $IrO_Y$ film 40b is set higher than the composition ratio X of oxygen of the $IrO_X$ film 40a.

Thus, the ferroelectric capacitors 42 each including the lower electrode 36, the ferroelectric film 38 and the upper electrode 40 are constituted.

On the ferroelectric film 38 and the upper electrodes 40, a barrier film 44 is formed, covering the upper surfaces and the side surfaces of the ferroelectric film 38 and the upper electrodes 40. The barrier film 44 is, e.g., a 20–100 nm-thickness aluminum oxide film ($Al_2O_3$).

The barrier film 44 has the function of preventing the diffusion of hydrogen and water. When hydrogen or water arrives at the ferroelectric film 38 of the ferroelectric capacitors 42, the metal oxide forming the ferroelectric film 38 is reduced by the hydrogen or water, and the electric characteristics of the ferroelectric film 38 are deteriorated. The barrier film 44 is formed, covering the upper surfaces and the side surfaces of the ferroelectric film 38 and the upper electrodes 40, whereby hydrogen or water is prevented from arriving at the ferroelectric film 38, and accordingly the deterioration of the electric characteristics of the ferroelectric capacitors 42 can be suppressed.

A barrier film 46 is formed on the ferroelectric capacitors 42 and the silicon oxide film 34 covered with the barrier film 44. The barrier film 46 is, e.g., a 20–100 nm-thickness aluminum oxide film.

The barrier film 46 also has the function of preventing the diffusion of hydrogen and water, as does the barrier film 44.

An inter-layer insulation film 48 of, e.g., a 1500 nm-thickness silicon oxide film is formed on the barrier film 46. The surface of the inter-layer insulation film 48 is planarized.

In the inter-layer insulation film 48, the barrier film 46, the silicon oxide film 34 and the inter-layer insulation film 27, contact holes 50a, 50b are formed respectively down to the source/drain diffused layer 22. In the inter-layer insulation film 48, the barrier film 46, the barrier film 44, a contact hole 52a is formed down to each upper electrode 40. In the inter-layer insulation film 48, the barrier film 46 and the barrier film 44, a contact hole 52b is formed down to each lower electrode 36.

In the contact holes 50a, 50b, a barrier metal film (not illustrated) of, e.g., a 20 nm-thickness Ti film and, e.g., a 50 nm-thickness TiN film sequentially laid is formed. Of the barrier metal film, the Ti film is formed for decreasing the contact resistance, and the TiN film is formed for preventing the diffusion of tungsten forming the conductor plugs. The barrier metal film formed in the respective contact holes, which will be described later is formed for the same purpose.

Conductor plugs 54a, 54b of tungsten are buried respectively in the contact holes 50a, 50b with the barrier film formed in.

On the inter-layer insulation film 48 and in each contact hole 52a, an interconnection 56a is formed, electrically connected to the conductor plug 54a and the upper electrode 40. On the inter-layer insulation film 48 and in each contact hole 52b, an interconnection 56b is formed, electrically connected to the lower electrode 36. On the inter-layer insulation film 48, an interconnection 56c is formed, electrically connected to the conductor plug 54b. The interconnections 56a, 56b, 56c (a first metal interconnection layer 56) are formed of the layer film of, e.g., a 150 nm-thickness TiN film, a 550 nm-thickness AlCu alloy film, a 5 nm-thickness Ti film and a 150 nm-thickness TiN film.

Thus, the source/drain diffused layer 22 of each transistor 24 and the upper electrode 40 of the ferroelectric capacitor 42 are electrically connected with each other via the conductor plug 54a and the interconnection 56a, and a 1T1C type memory cell of an FeRAM, including one transistor 24 and one ferroelectric capacitor 14 is constituted. Actually, a plurality of the memory cells are arranged in the memory cell regions of a FeRAM chip.

On the inter-layer insulation film 48 with the interconnections 56a, 56n, 56c formed on, a barrier film 58 is formed, covering the upper surfaces and the side surfaces of the interconnections 56a, 56b, 56c. The barrier film 58 is, e.g., a 20 nm-thickness aluminum oxide film.

The barrier film 58 has the function of preventing the diffusion of hydrogen or water, as does the barrier films 44, 46. The barrier film 58 is used for suppressing the damage by plasma.

A 2600 nm-thickness silicon oxide film 60, for example, is formed on the barrier film 58. The surface of the silicon oxide film 60 is planarized. The planarized silicon oxide film 60 remains in, e.g., a 1000 nm-thickness on the interconnections 56a, 56b, 56c.

The silicon oxide film 60 is formed by, as will be described later, forming the silicon oxide film 60, and then making the heat treatment with a heat treatment furnace and the heat treatment in a plasma atmosphere generated by using $N_2O$ gas or others. Accordingly, the water in the silicon oxide film 60 has been sufficiently removed, and a large amount of water is not released from the silicon oxide film 60 via the contact holes 68 when the conductor plugs 70 are buried in the contact holes 68. A large amount of water is not released from the silicon oxide film 60 via the contact holes when the conductor plugs 70 are buried in the contact holes 68, which permits the raw material gas forming the conductor plugs 70 to arrive at the insides of the contact holes 68. Thus, according to the present embodiment, the conductor plugs 70 can be surely buried in the contact holes 68, and a semiconductor device of high reliability can be provided.

The silicon oxide film 60 is formed by, as will be described later, having the surface planarized, and being subjected to the heat treatment with a heat treatment furnace and the heat treatment in a plasma atmosphere generated by using $N_2O$ gas or others. Accordingly, the water in the silicon oxide film 60 has been sufficiently removed. When the conductor plugs 70 are buried in the contact holes 68, a large amount of water is not released from the silicon oxide film 60 via the contact holes 68. This allows the conductor plugs 70 to be surely buried in the contact holes 68, and a semiconductor device of high reliability can be provided.

A 100 nm-thickness silicon oxide film 61, for example, is formed on the silicon oxide film 60. The silicon oxide film 61, which is formed on the flat silicon oxide film 60, is flat.

The silicon oxide film 61 is formed by, as will be described alter, forming the silicon oxide film 61, and making the heat treatment with a heat treatment furnace and the heat treatment in a plasma atmosphere generated by using $N_2O$ gas or others. Accordingly, the water in the silicon oxide film 61 has been sufficiently removed. When the conductor plugs 70 are buried in the contact holes 68, a large amount of water is not released via the contact holes 68 from the silicon oxide film 61, from which the water has been sufficiently removed, whereby the raw material gas forming the conductor plugs 70 can sufficiently arrive at the insides of the contact holes 68. Thus, according to the present embodiment, the conductor plugs 70 can be surely buried in the contact holes 68, and a semiconductor device of high reliability can be provided.

A barrier film 62 is formed on the silicon oxide film 61. The barrier film 62 is, e.g., a 20–70 nm-thickness aluminum oxide film. The barrier film 62 is a 50 nm-thickness aluminum oxide film here. The barrier film 62, which is formed on the flat silicon oxide film 61, is flat.

The barrier film 62 also has the function of preventing the diffusion of hydrogen and water, as do the barrier films 44, 46, 58. The barrier film 62, which is formed on the flat silicon oxide film 61, is flat and has much better coverage in comparison with the barrier films 44, 46, 58. Accordingly, such flat barrier film 62 can more surely prevent the diffusion of hydrogen and water. Actually, the barrier film 62 is formed not only in the memory cell region of the FeRAM chip, where a plurality of the memory cells including the ferroelectric capacitors 42 are arranged, but also on all over the FeRAM chip containing the peripheral circuit region, etc.

A 50–100 nm-thickness silicon oxide film 64, for example, is formed on the barrier film 62. The film thickness of the silicon oxide film 64 is set at 100 nm. The silicon oxide film 64 is for preventing the barrier film 62 from being etched when the conduction film is patterned to form the interconnections 72a, 72b.

The silicon oxide film 64 is formed by, as will be described later, forming the silicon oxide film 64 and then forming the heat treatment with a heat treatment furnace and making the heat treatment in a plasma atmosphere generated by using $N_2O$ gas or others. Accordingly, the water in the silicon oxide film 64 is sufficiently removed. When the conductor plug 70 is buried in the contact hole 68, the release of a large amount of water from the silicon oxide film 64, from which the water has been sufficiently removed, can be prevented. A large amount of water is not released from the silicon oxide film 64 via the contact holes 68, which allows the raw material gas forming the conductor plug 70 to sufficiently arrive at the insides of the contact hole 68. Thus, according to the present embodiment, the conductor plug 70 can be surely buried in the contact hole 68, and a semiconductor device of high reliability can be provided.

Thus, the barrier film 58, the silicon oxide film 60, the silicon oxide film 61, the barrier film 62 and the silicon oxide film 64 form the inter-layer insulation film 66.

In the inter-layer insulation film 66, a contact hole 68 is formed down to the interconnection 56c.

In the contact hole 68, a barrier metal film (not illustrated) of, e.g., a 20 nm-thickness Ti film and, e.g., a 50 nm-thickness TiN film sequentially laid is formed. The barrier metal film may be formed of TiN film alone without Ti film.

A conductor plug 70 of tungsten is buried in the contact hole 68 with the barrier metal film formed in.

An interconnection 72a is formed on the inter-layer insulation film 66. On the inter-layer insulation film 66, an interconnection 72b is formed, electrically connected to the conductor plug 70. The interconnections 72a, 72b (a second metal interconnection layer 72) are formed of the layer film of, e.g., a 50 nm-thickness TiN film, a 500 nm-thickness AlCu alloy film, a 5 nm-thickness Ti film and a 150 nm-thickness TiN film.

On the inter-layer insulation film 66 and the interconnections 72a, 72b, a 2200 nm-thickness silicon oxide film 74 is formed. The surface of the silicon oxide film 74 is planarized.

The silicon oxide film 74 is formed by, as will be described layer, by having the surface planarized, and then being subjected to the heat treatment with a heat treatment furnace and the heat treatment in a plasma atmosphere generated by using $N_2O$ gas or others. Accordingly, the water in the silicon oxide film 74 is sufficiently removed. When conductor plugs 86a, 86b are buried in contact holes 84a, 84b, a large amount of water is not released from the silicon oxide film 74, from which the water has been removed in a large amount. When the conductor plugs 86a, 86b are buried in the contact holes 84a, 84b, the water in the silicon oxide film 76 is not released in a large amount, which permits the raw material gas forming the conductor plugs 86a, 86b to sufficiently arrive at the insides of the contact holes 84a, 84b. Thus, according to the present embodiment, the conductor plugs 86a, 86b can be surely buried in the contact holes 84a, 84b, and a semiconductor device of high reliability can be provided.

A 100 nm-thickness silicon oxide film 76, for example, is formed on the silicon oxide film 74. The silicon oxide film 76, which is formed on the planarized silicon oxide film 74, is flat.

The silicon oxide film 76 is formed by, as will be described layer, by forming the silicon oxide film 76, and then being subjected to the heat treatment with a heat treatment furnace and the heat treatment in a plasma atmosphere generated by using $N_2O$ gas or others. Accordingly, the water in the silicon oxide film 76 is sufficiently removed. When conductor plugs 86a, 86b are buried in contact holes 84a, 84b, a large amount of water is not released from the silicon oxide film 76, from which the water has been removed in a large amount. When the conductor plugs 86a, 86b are buried in the contact holes 84a, 84b, a large amount of water is not released from the silicon oxide film 76, which permits the raw material gas forming the conductor plugs 86a, 86b to sufficiently arrive at the insides of the contact holes 84a, 84b. Thus, according to the present embodiment, the conductor plugs 86a, 86b can be surely buried in the contact holes 84a, 84b, and a semiconductor device of high reliability can be provided.

A barrier film 78 is formed on the silicon oxide film 76. The barrier film 78 is, e.g., a 20–100 nm-thickness aluminum oxide film. The barrier film 78 is a 50 nm-thickness aluminum oxide film. The barrier film 78, which is formed on the flat silicon oxide film 76, is flat.

The barrier film 78 has the function of preventing the diffusion of hydrogen and water, as do the barrier films 44, 46, 58, 62. Furthermore, the barrier film 78, which is formed on the flat silicon oxide film 76, is flat and has much better coverage in comparison with the barrier films 44, 46, 58, as does the barrier film 62. Accordingly, such flat barrier film 78 can more surely prevents the diffusion of hydrogen and water. Actually, the barrier film 78 as well as the barrier film 62 is formed not only in the memory cell region of the FeRAM, where a plurality of the memory cells are arranged, but also all over the FeRAM chip including the peripheral circuit region, etc.

A 100 nm-thickness silicon oxide film 80, for example, is formed on the barrier film 78. The barrier film 80 is for preventing the barrier film 78 from being etched when the conduction film is patterned to form interconnections 88a, 88b.

The silicon oxide film 80 is formed by, as will be described later, making the heat treatment with a heat treatment furnace and the heat treatment in a plasma atmosphere generated by using $N_2O$ gas or others. Accordingly, the water in the silicon oxide film 80 has been sufficiently removed. When the conductor plugs 86a, 86b are buried in the contact holes 84a, 84b, a large amount of water is not released from the silicon oxide film 80 via the contact holes 84a, 84b. When the conductor plugs 86a, 86b are buried in the contact holes 84a, 84b, the water in the silicon oxide film 80 is not released in a large amount via the contact holes 84a, 84b, which permits the raw material gas forming the conductor plugs 86a, 86b to sufficiently arrive at the insides of the contact holes 84a, 84b. Thus, according to the present embodiment, the conductor plugs 86a, 86b can be buried in the contact holes 84a. 84b, and a semiconductor device of high reliability can be provided.

Thus, the silicon oxide film 74, the silicon oxide film 76, the barrier film 78 and the silicon oxide film 80 form an inter-layer insulation film 82.

Contact holes 84a, 84b are formed in the inter-layer insulation film 82 down to the interconnections 72a, 72b.

In the contact holes 84a, 84b, a barrier metal film (not illustrated) of the layer film of, e.g., a 20 nm-thickness Ti film and, e.g., a 50 nm-thickness TiN film sequentially laid is formed. The barrier metal film is formed of TiN film alone without Ti film.

Conductor plugs 86a, 86b are buried respectively in the contact holes 84a, 84b with the barrier metal film formed in.

On the inter-layer insulation film 82 with the conductor plugs 86a, 86b buried in, an interconnection 88a electrically connected to the conductor plug 86a, and interconnection (bonding pad) 88b electrically connected to the conductor plug 86b are formed. The interconnections 88a, 88b (a third metal interconnection layer 88) is formed of the layer film of, e.g., a 50 nm-thickness TiN film, a 500 nm-thickness AlCu alloy-film and a 150 nm-thickness TiN film sequentially laid.

On the inter-layer insulation film 82 and the interconnections 88a, 88b, a 100–300 nm-thickness silicon oxide film 90, for example, is formed. The film thickness of the silicon oxide film 90 is set at 100 nm here.

On the silicon oxide film 90, a 350 nm-thickness silicon nitride film 92, for example, is formed.

On the silicon nitride film 92, a 2–6 μm-thickness polyimide resin film 94 is formed.

In the polyimide resin film 94, the silicon nitride film 92 and the silicon oxide film 90, an opening 96 is formed down to the interconnection (bonding pad) 88b. That is, in the silicon nitride film 92 and the silicon, oxide film 90, an opening 96a is formed down to the interconnection (bonding pad) 88b. An opening 96b is formed in the region of a polyimide resin film 94, which contains the opening 96a formed in the silicon nitride film 92 and the silicon oxide film 90.

An outside circuit (not illustrated) is electrically connected to the interconnection (bonding pad) 88b via the opening 96.

Thus, the semiconductor device according to the present embodiment is constituted.

(The Method for Fabricating the Semiconductor Device)

Next, the method for fabricating the semiconductor device will be explained with reference to FIGS. 4A to 17B. FIGS. 4A to 17B are sectional views of the semiconductor device according to the present embodiment in the steps of the method for fabricating the semiconductor device, which illustrate the method.

First, the device isolation regions 12 for defining the device regions are formed on the semiconductor substrate 10 of, e.g., silicon by, e.g., LOCOS (LOCal Oxidation of Silicon).

Next, a dopant impurity is implanted by ion implantation to form the wells 14a, 14b.

Figure 4A:
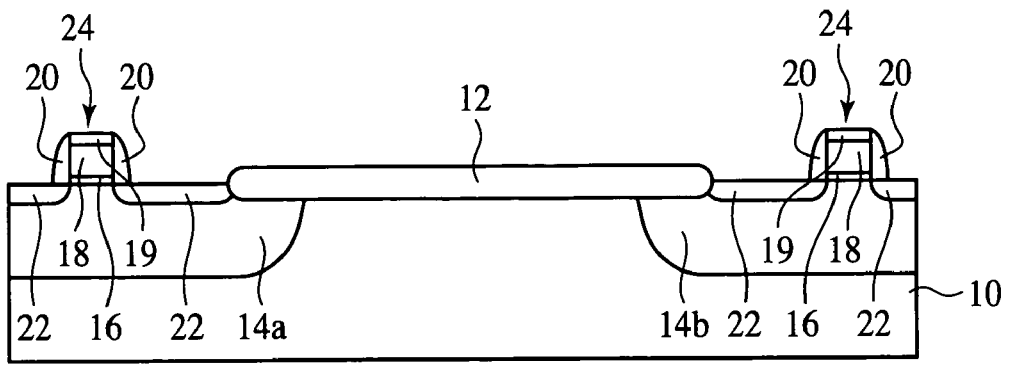
FIGS. 4A to 4C are sectional views of the semiconductor device according to the embodiment of the present invention in the steps of the method for fabricating the semiconductor device, which illustrate the method (Part 1).

Then, the transistors 24 each including the gate electrode (gate interconnection) 18, and the source/drain diffused layer 22 in the device regions by the usual transistor forming method (see FIG. 4A).

Next, the 200 nm-thickness SiON film 25, for example, is formed on the entire surface by, e.g., plasma CVD (Chemical Vapor Deposition).

Figure 4B:
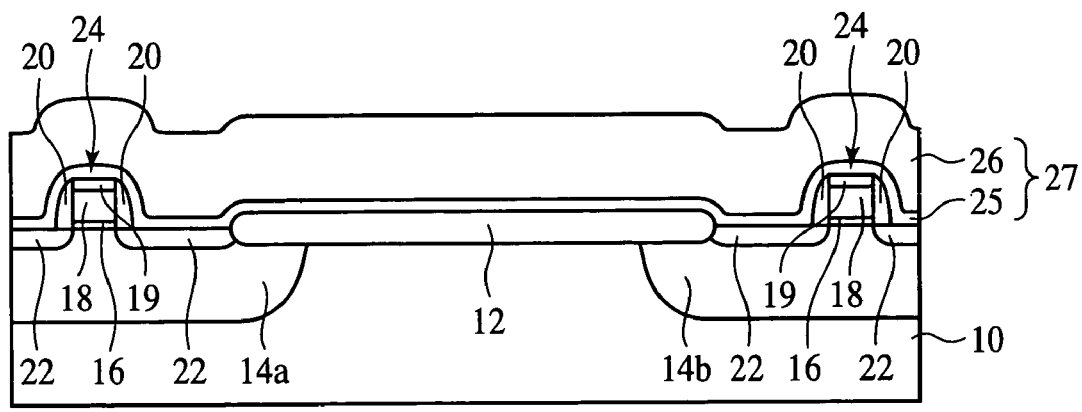

Next, the 600 nm-thickness silicon oxide film 26, for example, is formed on the entire surface by plasma TEOSCVD (see FIG. 4B).

Figure 4C:
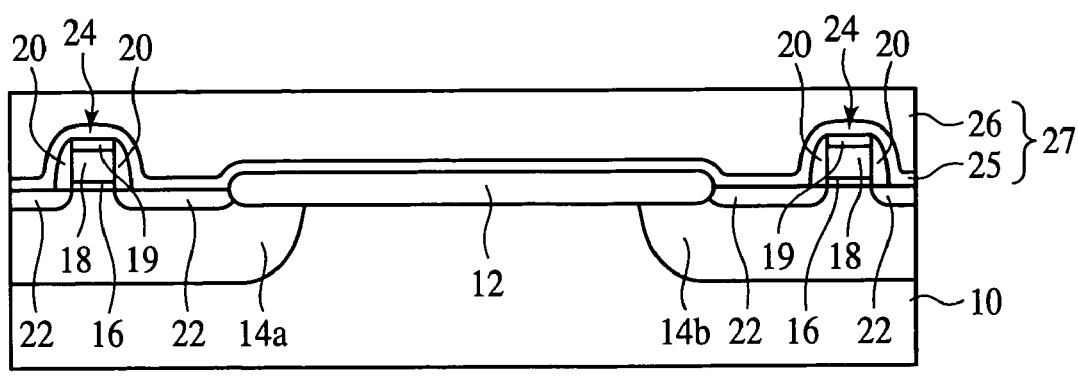

Next, the surface of the silicon oxide film 26 is planarized by, e.g., CMP (see FIG. 4C).

Thus, the inter-layer insulation film 27 of the SiON film 25 and the silicon oxide film 26 is formed.

Next, the heat treatment is made at, e.g., 650° C. for 30 minutes in an atmosphere generated by using dinitrogen monoxide ($N_2O$) or nitrogen ($N_2$).

Figure 5A:
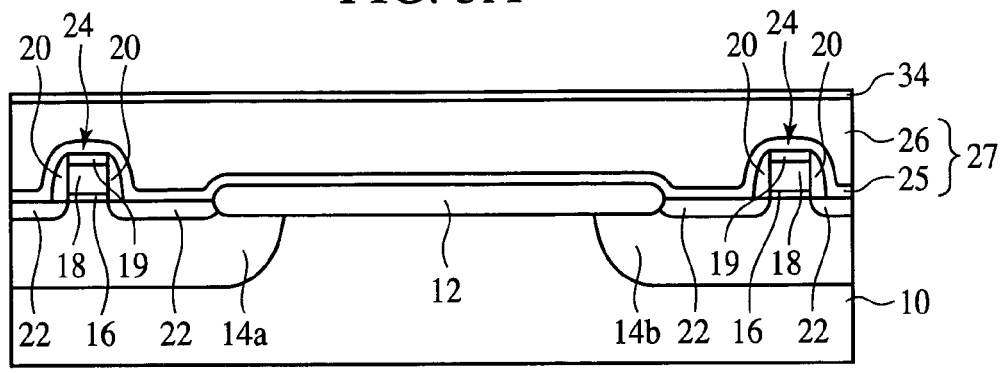
FIGS. 5A to 5C are sectional views of the semiconductor device according to the embodiment of the present invention in the steps of the method for fabricating the semiconductor device, which illustrate the method (Part 2).

Next, the 100 nm-thickness silicon oxide film 34, for example, is formed on the entire surface by, e.g., plasma TEOSCVD (see FIG. 5A).

Next, the heat treatment is made at, e.g., 350° C. for 2 minutes in a plasma atmosphere generated by using $N_2O$ gas.

Then, the 20–50 nm-thickness aluminum oxide film 36a, for example, is formed on the entire surface by, e.g., sputtering or CVD.

Then, the heat treatment is made in an oxygen atmosphere by, e.g., RTA (Rapid Thermal Annealing). The heat treatment temperature is, e.g., 650° C., and the heat treatment period of time is, e.g., 1–2 minutes.

Next, the 100–200 nm-thickness Pt film 36b, for example, is formed on the entire surface by, e.g., sputtering.

Thus, the layer film 36 of the aluminum oxide film 36a and the Pt film 36b is formed. The layer film 36 is to be the lower electrodes of the ferroelectric capacitors 42.

Next, the ferroelectric film 38 is formed on the entire surface by, e.g., sputtering. The ferroelectric film 38 is, e.g., the 100–250 nm-thickness PZT film.

The ferroelectric film 38 is formed by sputtering here but is not formed essentially by sputtering. The ferroelectric film may be formed by, e.g., sol gel process, MOD (Metal Organic Deposition), MOCVD, etc.

Then, the heat treatment is made in an oxygen atmosphere by, e.g., RTA. The heat treatment temperature is, e.g., 550–600° C., and the heat treatment period of time is, e.g., 60–120 seconds.

Next, the 25–75 nm-thickness $IrO_X$ film 40a, for example, is formed by, e.g., sputtering or MOCVD.

Next, the heat treatment is made in an argon or oxygen atmosphere at, e.g., 600–800° C. for 10–100 seconds.

Next, the 150–250 nm-thickness $IrO_Y$ film 40b is formed by, e.g., sputtering or MOCVD. At this time, the $IrO_Y$ film 40b is formed so that the composition ratio Y of the oxygen of the $IrO_Y$ film 40b is higher than the composition ratio X of the oxygen of the $IrO_X$ film 40a.

Figure 5B:
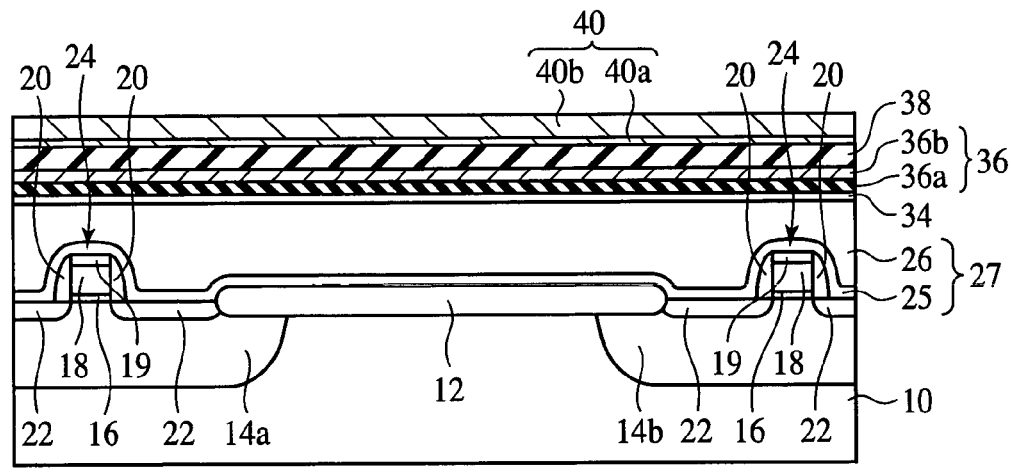
Figure 5C:
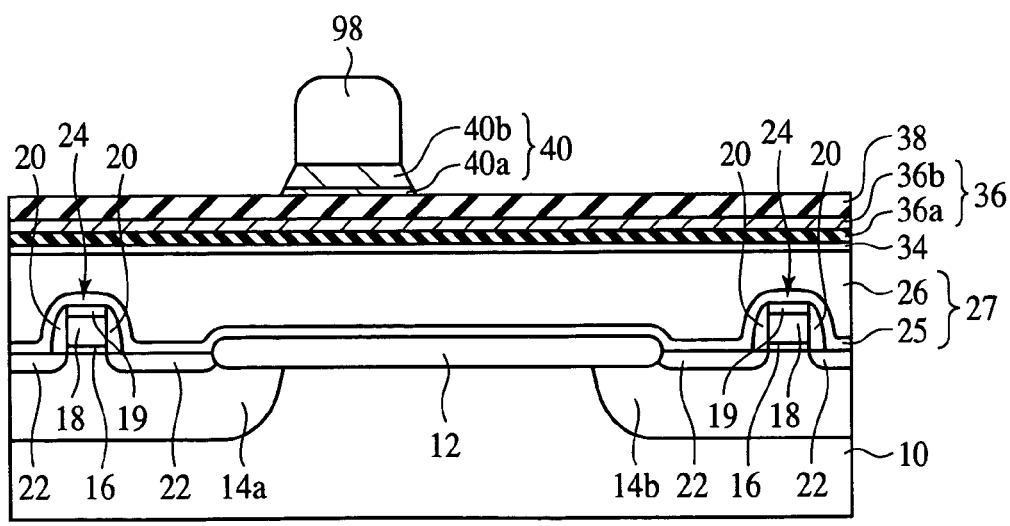

Thus, the layer film 40 is formed of the $IrO_X$ film 40a and the $IrO_Y$ film 40b (see FIG. 5B). The layer film 40 is to be the upper electrodes of the ferroelectric capacitors 42.

Next, a photoresist film 98 is formed on the entire surface by, e.g., spin coating.

Next, the photoresist film 98 is patterned into the plane shape of the upper electrodes 40 of the ferroelectric capacitors 42 by photolithography.

Next, with the photoresist film 98 as the mask, the layer film 40 is etched. The etching gas is, e.g., Ar gas and $Cl_2$ gas. Thus, the upper electrodes 40 of the layer film are formed (see FIG. 5C). Then, the photoresist film 98 is released.

Next, the heat treatment is made in, e.g., an oxygen atmosphere at, e.g., 400–700° C. for 30–120 minutes. The heat treatment is for preventing the occurrence of abnormalities in the surface of the upper electrodes 40.

Next, a photoresist film 100 is formed on the entire surface by, e.g., spin coating.

Next, the photoresist film 100 is patterned into the plane shape of the ferroelectric film 38 of the ferroelectric capacitors 42 by photolithography.

Figure 6A:
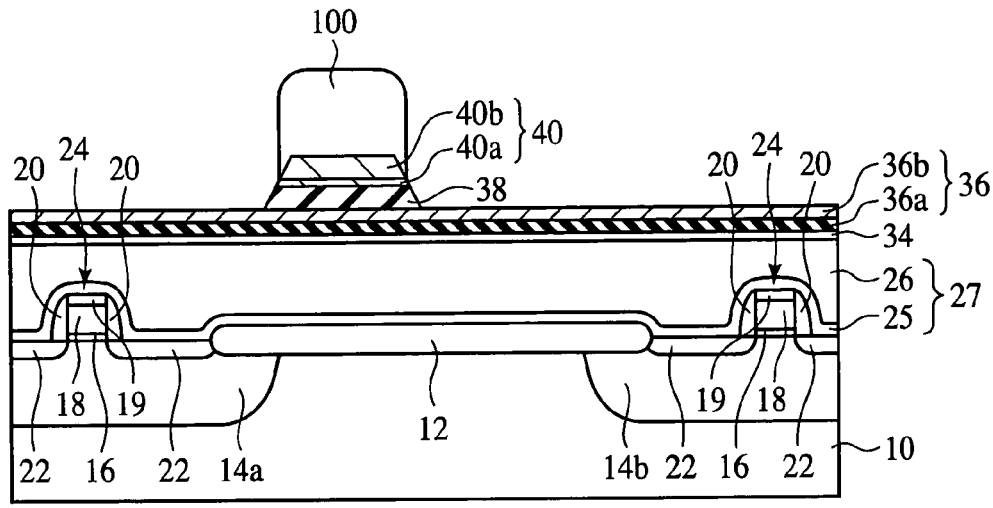
FIGS. 6A to 6C are sectional views of the semiconductor device according to the embodiment of the present invention in the steps of the method for fabricating the semiconductor device, which illustrate the method (Part 3).

Next, with the photoresist film 100 as the mask, the ferroelectric film 38 is etched (see FIG. 6a). Then, the photoresist film 100 is released.

Next, the heat treatment is made in an oxygen atmosphere at, e.g., 300–400° C. for 30–12 minutes.

Figure 6B:
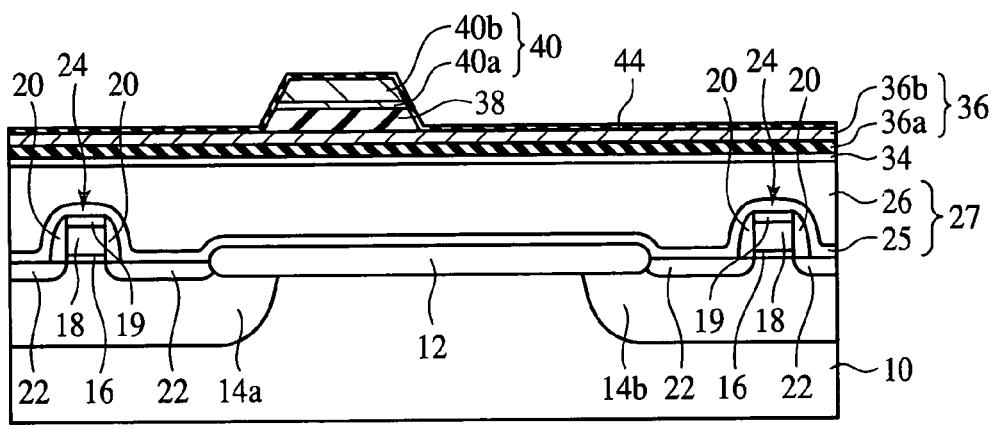

Next, the barrier film 44 is formed by, e.g., sputtering or CVD (see FIG. 6B). The barrier film 44 is, e.g., the 20–50 nm-thickness aluminum oxide film.

Next, the heat treatment is made in an oxygen atmosphere at, e.g., 400–600° C. for 30–120 minutes.

Next, a photoresist film 102 is formed on the entire surface by, e.g., spin coating.

Next, the photoresist film 102 is patterned into the plane shape of the lower electrodes 36 of the ferroelectric capacitors 42 by photolithography.

Figure 6C:
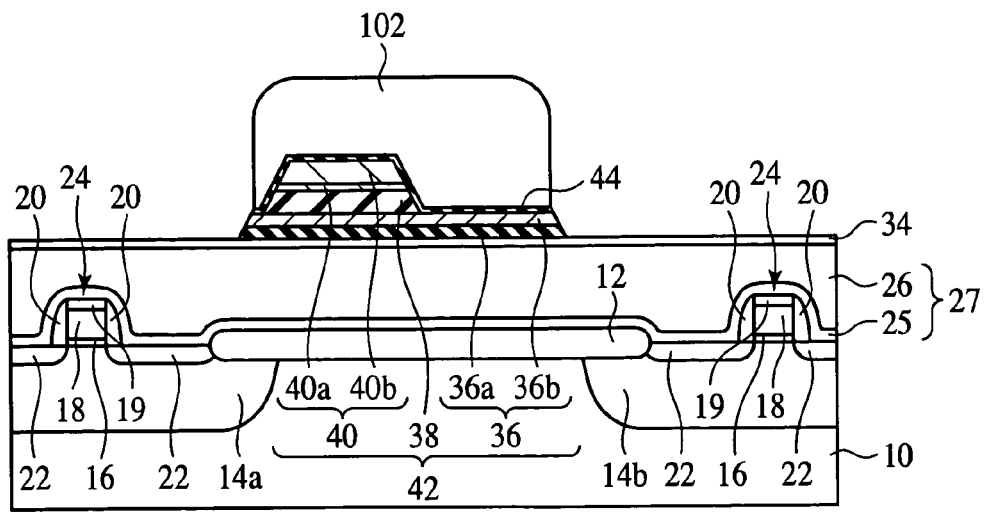

Next, with the photoresist film 102 as the mask, the barrier film 44 and the layer film 36 are etched (see FIG. 6C). Thus, the lower electrodes 36 of the layer film are formed. The barrier film 44 is left, covering the upper electrodes 40 and the ferroelectric film 38. Then, the photoresist film 102 is released.

Next, the heat treatment is made in an oxygen atmosphere at, e.g., 400–600° C. for 30–120 minutes.

Next, the barrier film 46 is formed on the entire surface by, e.g., sputtering or CVD. The barrier film 46 is, e.g., a 20–100 nm-thickness aluminum oxide film (see FIG. 7A). Thus, the barrier film 46 is formed, further covering the ferroelectric capacitors 42 covered by the barrier film 44.

Next, the heat treatment is made in an oxygen atmosphere at, e.g., 500–700° C. for 30–120 minutes.

Figure 7A:
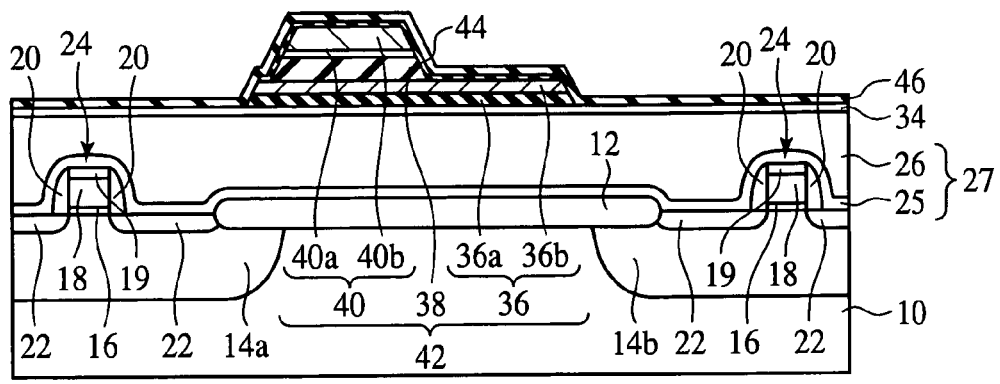
FIGS. 7A to 7C are sectional views of the semiconductor device according to the embodiment of the present invention in the steps of the method for fabricating the semiconductor device, which illustrate the method (Part 4).
Figure 7B:
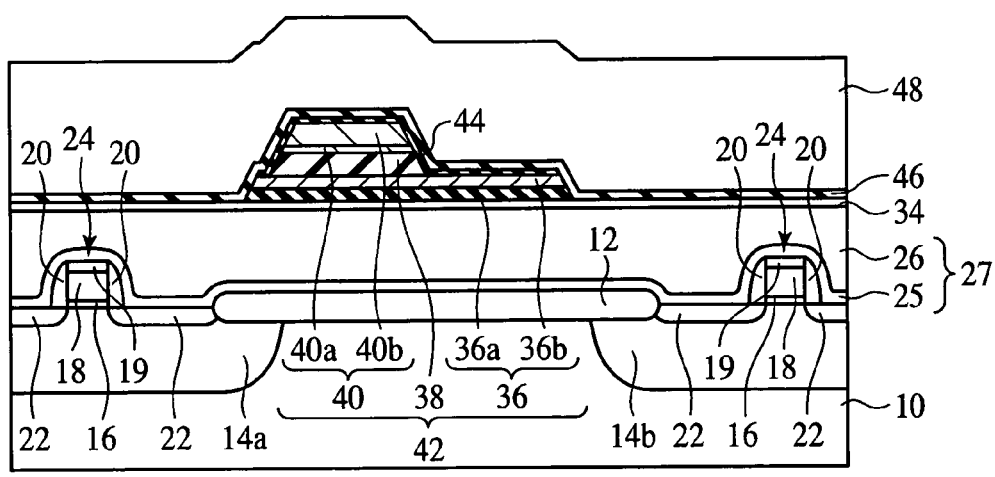

Next, the inter-layer insulation film 48 of the 1500 nm-thickness silicon oxide film, for example, is formed on the entire surface by, e.g., plasma TEOSCVD (see FIG. 7B).

Figure 7C:
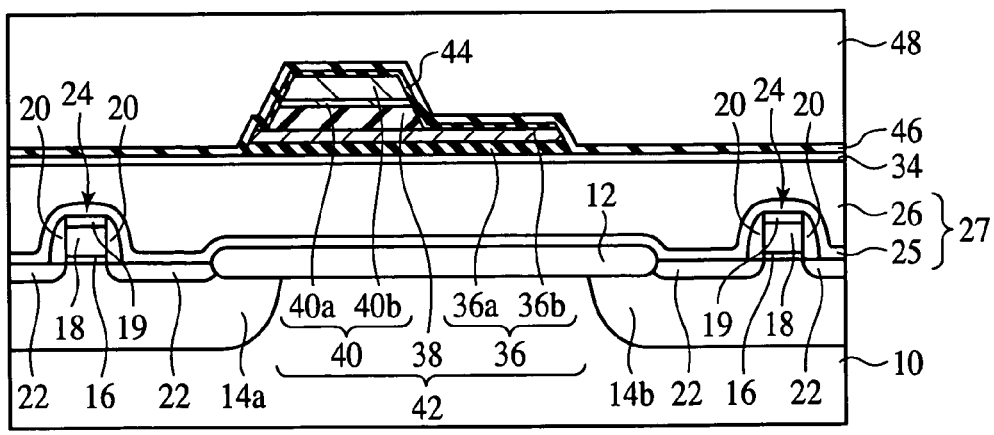

Next, the surface of the inter-layer insulation film 48 is planarized by, e.g., CMP (see FIG. 7C).

Next, the heat treatment in a plasma atmosphere generated by using $N_2O$ gas or $N_2$ gas at, e.g., 350° C. for 2 minutes. The heat treatment is for removing the water therein while modifying the film quality thereof to make it difficult for water to enter the inter-layer insulation film 48. The heat treatment nitrides the surface of the inter-layer insulation film 48, and SiON film (not illustrated) is formed on the surface of the inter-layer insulation film 48.

Figure 8A:
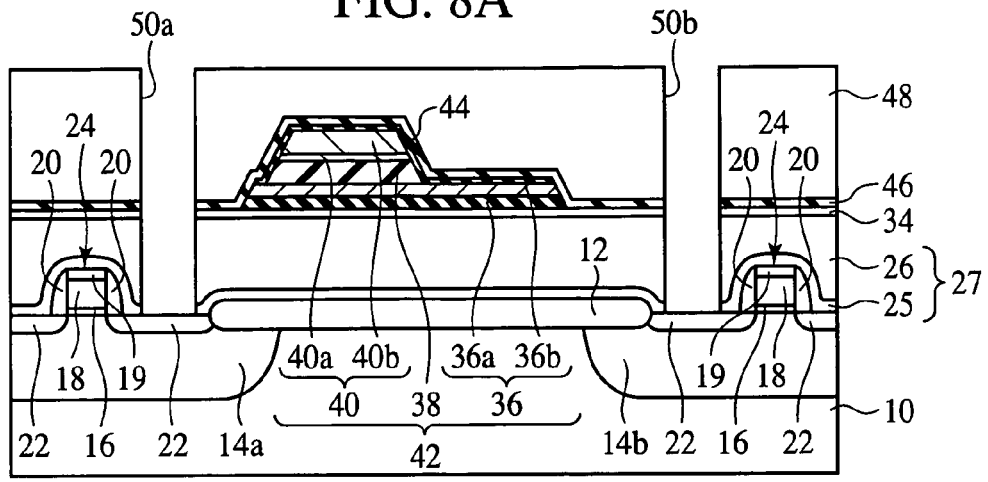
FIGS. 8A to 8C are sectional views of the semiconductor device according to the embodiment of the present invention in the steps of the method for fabricating the semiconductor device, which illustrate the method (Part 5).
Figure 8B:
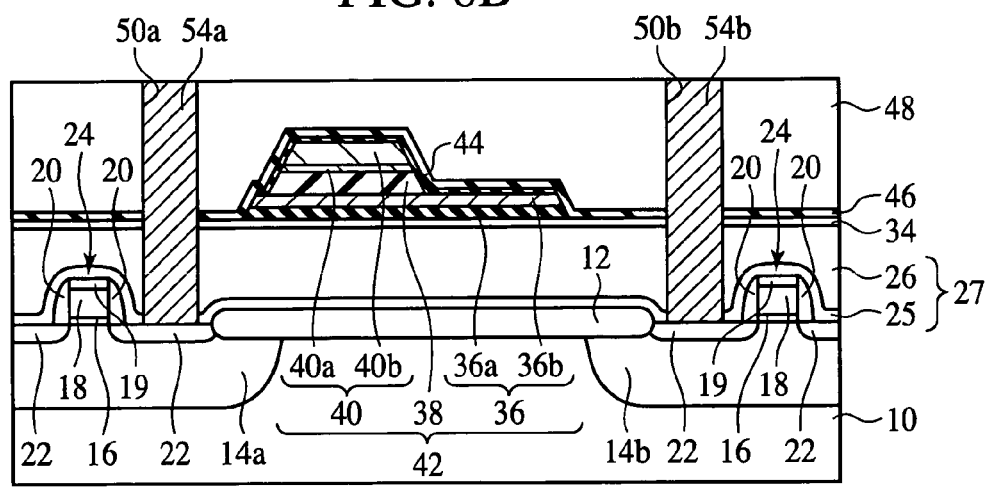

Then, the contact holes 50a, 50b are formed in the inter-layer insulation film 48, the barrier film 46, the silicon oxide film 34 and the inter-layer insulation film 27 down to the source/drain diffused layer 22 by photolithography and etching (see FIG. 8A).

Next, the 20 nm-thickness Ti film, for example, is formed on the entire surface by, e.g., sputtering. Then, the 50 nm-thickness TiN film, for example, is formed on the entire surface by, e.g., sputtering. Thus, the barrier metal film (not illustrated) of the Ti film and the TiN film is formed.

Next, the 500 nm-thickness tungsten film, for example, is formed on the entire surface by, e.g., CVD.

Next, the tungsten film and the barrier metal film are polished by, e.g., CMP until the surface of the inter-layer insulation film 48 is exposed. Thus, the conductor plugs 54a, 54b of tungsten are buried respectively in the contact holes 50a, 50b (see FIG. 8B).

Next, plasma cleaning is made with, e.g., argon gas. Thus, natural oxide film, etc. present on the surface of the conductor plugs 54a, 54b are removed.

Next, the 100 nm-thickness SiON film 104 is formed on the entire surface by, e.g., CVD.

Figure 8C:
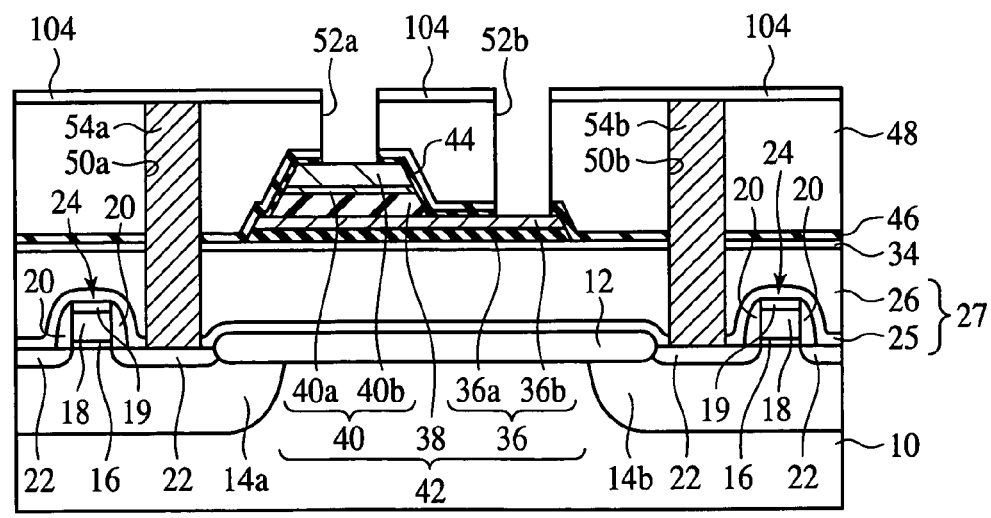
Figure 9A:
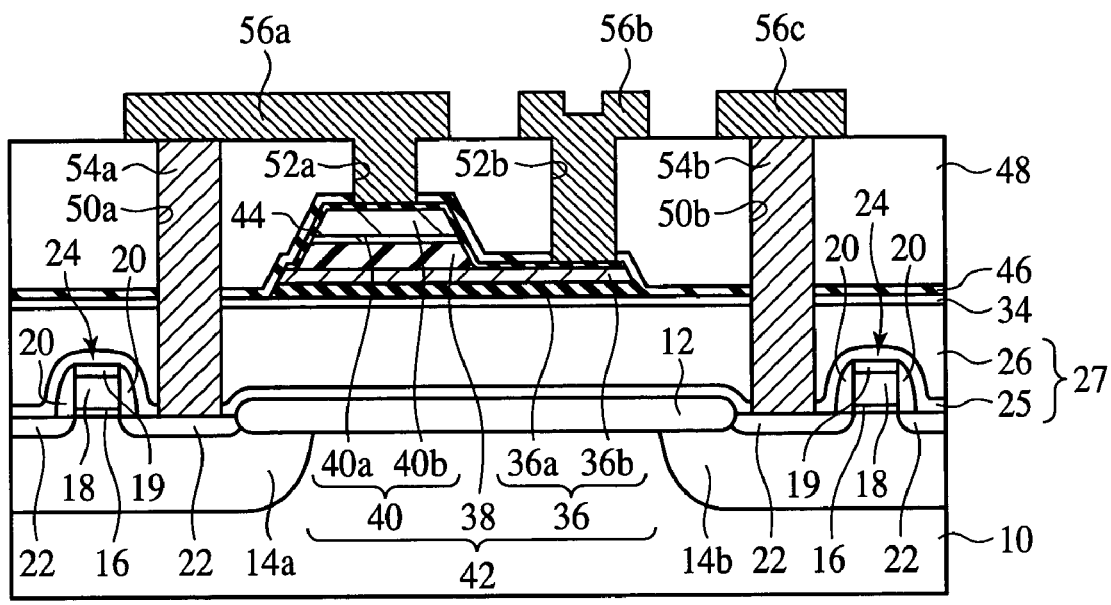
FIGS. 9A and 9B are sectional views of the semiconductor device according to the embodiment of the present invention in the steps of the method for fabricating the semiconductor device, which illustrate the method (Part 6).
Figure 9B:
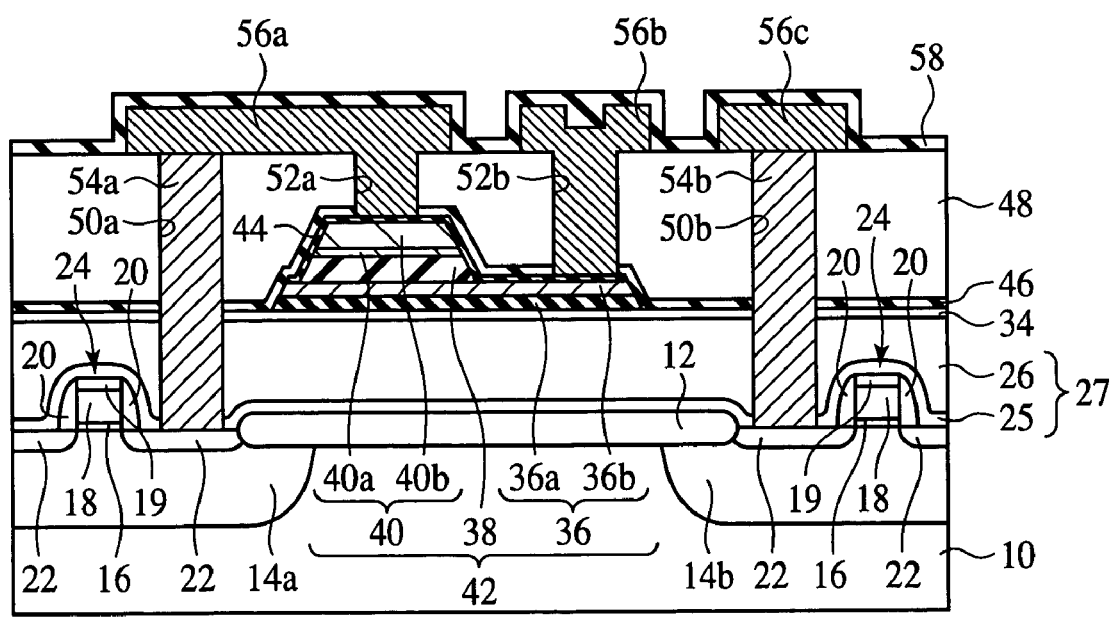

Then, by photolithography and dry etching, the contact holes 52a and the contact holes 52b are formed in the SiON film 104, the inter-layer insulation film 48, the barrier film 46 and the barrier film 44 respectively down to the upper electrodes 40 of the ferroelectric capacitors 42 and down to the lower electrodes 36 of the ferroelectric capacitors 42 (see FIG. 8C).

Next, the heat treatment is made in an oxygen atmosphere by, e.g., at 400–600° C. for 30–120 minutes. The heat treatment is for supplying oxygen to the ferroelectric film 38 of the ferroelectric capacitors 42 and restoring the electric characteristics of the ferroelectric capacitors 42. The heat treatment is made in an oxygen atmosphere here but may be made in an ozone atmosphere. The heat treatment in an ozone atmosphere can feed oxygen to the ferroelectric film 38 of the capacitors and restore the electric characteristics of the ferroelectric capacitors 42.

Then, the SiON film 104 is etched off.

Next, the 150 nm-thickness TiN film, for example, the 550 nm-thickness AlCu alloy film, for example, the 5 nm-thickness Ti film, for example, the 150 nm-thickness TiN film, for example are sequentially laid on the entire surface. Thus, the conductor film of the TiN film, the AlCu alloy film, the Ti film and the TiN film sequentially laid is formed.

Then, the conductor film is patterned by photolithography and dry etching. Thus, the first metal interconnection layer 56, i.e., the interconnections 56a electrically connected to the upper electrodes 40 of the ferroelectric capacitors 42 and the conductor plugs 54a are formed. The interconnections 56b electrically connected to the lower electrodes 36 of the ferroelectric capacitors 42 are formed. The interconnections 56c electrically connected to the conductor plugs 54b are formed (see FIG. 9A).

Next, the heat treatment is made in an oxygen atmosphere at, e.g., 350° C. for 30 minutes.

Then, the barrier film 58 is formed on the entire surface by, e.g., sputtering or CVD. The barrier film 58 is, e.g., a 20–70 nm-thickness aluminum oxide film (see FIG. 9B). The barrier film 58 is a 20 nm-thickness aluminum oxide film here. Thus, the barrier film 58 is formed, covering the upper surfaces and the side surfaces of the interconnections 56a, 56b, 56c.

Figure 10A:
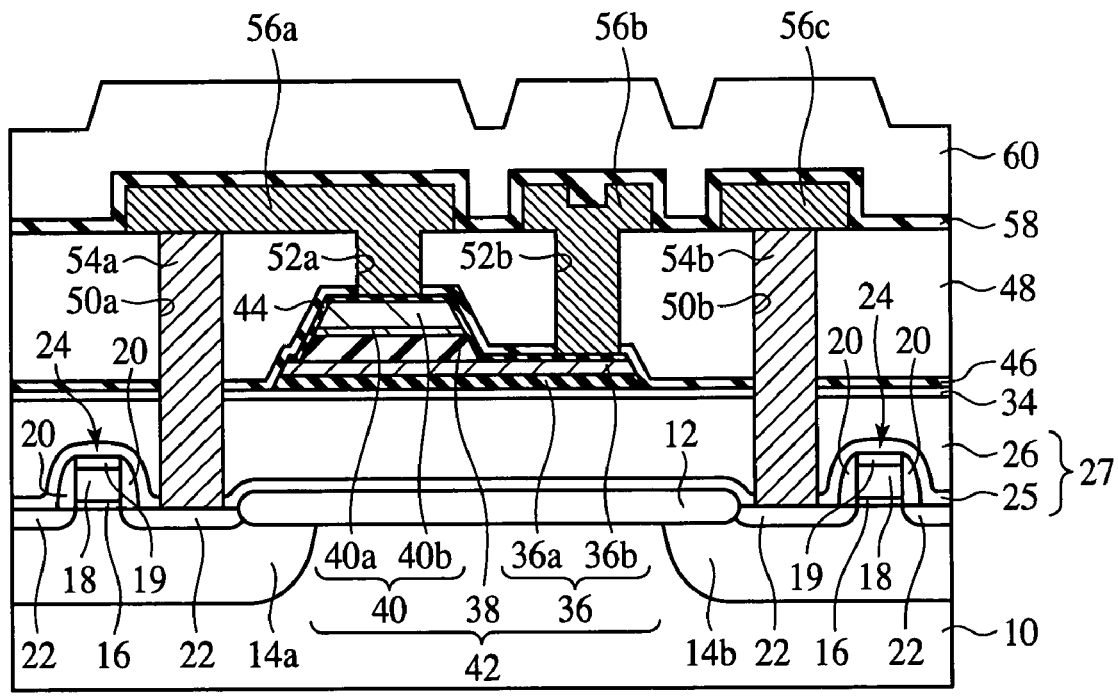
FIGS. 10A and 10B are sectional views of the semiconductor device according to the embodiment of the present invention in the steps of the method for fabricating the semiconductor device, which illustrate the method (Part 7).

Then, the 2600 nm-thickness silicon oxide film 60, for example, is formed on the entire surface by, e.g., plasma TEOSCVD (see FIG. 10A). The radiofrequency electric power applied between the electrodes in generating the plasma is, e.g., 200 W.

Figure 10B:
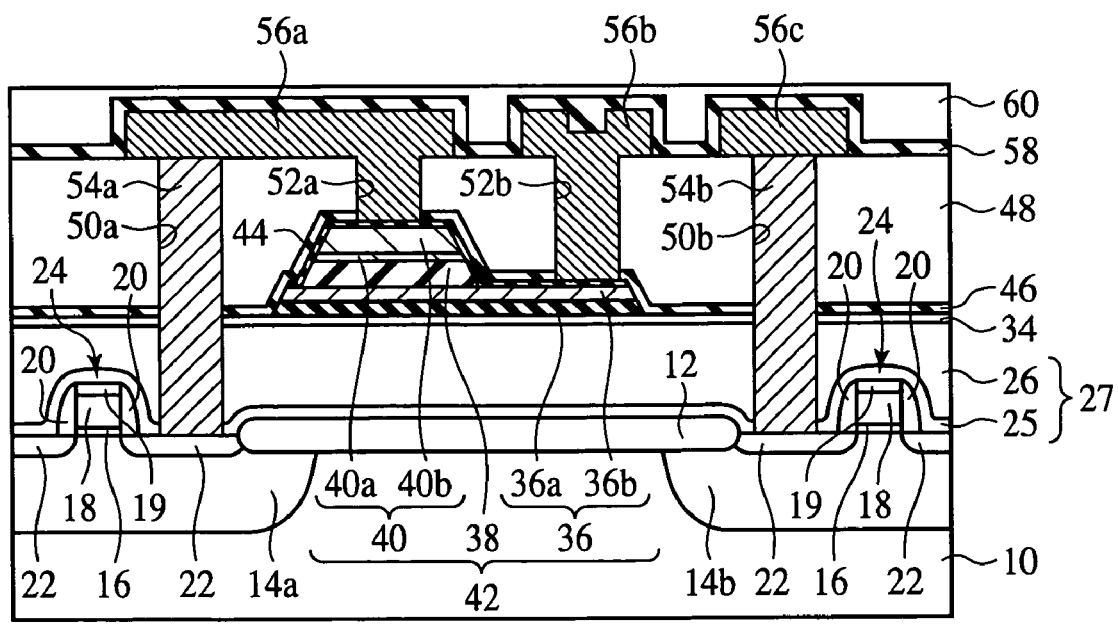

Next, the surface of the silicon oxide film 60 is planarized by, e.g., CMP (FIG. 10B).

Next, the semiconductor substrate 10 is loaded into a heat treatment furnace to make the heat treatment. The heat treatment is for removing the water in the silicon oxide film 60. The gas fed into the heat treatment furnace for the heat treatment is, e.g., $N_2O$ gas or $N_2$ gas. The flow rate of $N_2O$ gas or $N_2$ gas fed into the heat treatment furnace for the heat treatment is, e.g., 10000–20000 sccm. The pressure for the heat treatment is, e.g., the atmospheric pressure. The substrate temperature for the heat treatment is, e.g., 350–650° C. The heat treatment period of tine is, e.g., 30–120 minutes.

Then, the heat treatment is made in the plasma atmosphere generated by using $N_2O$ gas or $N_2$ gas. The heat treatment is for further removing the water in the silicon oxide film 60 and modifying the film quality of the silicon oxide film 60 to make it difficult for water to enter the silicon oxide film 60. The heat treatment nitrides the surface of the silicon oxide film 60, and SION film (not illustrated) is formed on the surface of the silicon oxide film 60. The substrate temperature for the heat treatment is, e.g., 350–400° C. The heat treatment period of time is, e.g., 2–4 minutes. The flow rate of the $N_2O$ gas or the $N_2$ gas is, e.g., about 350 sccm.

According to the present embodiment, after the silicon oxide film 60 has been planarized, the heat treatment with a heat treatment furnace, and the heat treatment in the plasma atmosphere generated by using $N_2O$ gas or $N_2$ gas are made, whereby the water in the silicon oxide film 60 can be sufficiently removed. Because the water in the silicon oxide film 60 has been sufficiently removed, a large amount of water is not released, via the contact holes 68 from the silicon oxide film 60 when the conductor plugs 70 are buried in the contact holes 68. A large amount of water is not released from the silicon oxide 60 when the conductor plugs 70 are buried in the contact holes 68, which permits the raw material gas forming the conductor plugs 70 to sufficiently arrive at the insides of the contact holes 68. Thus, according to the present embodiment, the conductor plugs 70 can be surely buried in the contact holes 68, and a semiconductor device of high reliability can be provided.

The heat treatment in a plasma atmosphere generated by using $N_2O$ gas or $N_2$ gas follows the heat treatment with a heat treatment furnace here. However, the heat treatment with a heat treatment furnace may follow the heat treatment in a plasma atmosphere generated by using $N_2O$ gas or $N_2$ gas.

However, in view of removing the water in the silicon oxide film 60 is a larger amount, the heat treatment in a plasma atmosphere generated by using $N_2O$ gas or $N_2$ gas following the heat treatment with a heat treatment furnace is preferable to the heat treatment with a heat treatment furnace following the heat treatment in a plasma atmosphere generated by using $N_2O$ gas or $N_2$ gas.

Then, the 100 nm-thickness silicon oxide film 61, for example, is formed on the planarized silicon oxide film 60 by, e.g., plasma TEOSCVD. The radiofrequency power applied between the electrodes for generating the plasma is, e.g., 200 W. The silicon oxide film 61, which is formed on the planarized silicon oxide film 60, is flat.

Then, the semiconductor substrate 10 is loaded into a heat treatment furnace to make the heat treatment. The heat treatment is for removing the water in the silicon oxide film 61. The gas fed into the heat treatment furnace for the heat treatment is, e.g., $N_2O$ gas or $N_2$ gas. The flow rate of the $N_2O$ gas or $N_2$ gas fed into the heat treatment furnace is, e.g., 10000–20000 sccm. The pressure in the heat treatment furnace is, e.g., atmospheric pressure. The substrate temperature for the heat treatment is, e., 350–650° C. The heat treatment period of time is, e.g., 30–120 minutes.

Then, the heat treatment in a plasma atmosphere generated by using $N_2O$ gas or $N_2$ gas is made. The heat treatment is for further removing the water in the silicon oxide film 61 and modifying the film quality of the silicon oxide film 61 to make it difficult for water to enter the silicon oxide film 61. The heat treatment nitrides the surface of the silicon oxide film 61, and SiON film (not illustrated) is formed on the surface of the silicon oxide film 61. The substrate temperature for the heat treatment is, e.g., 350–400° C. The heat treatment period of time is, e.g., 2–4 minutes. The flow rate of the $N_2O$ gas or $N_2$ gas is, e.g., about 350 sccm.

According to the present embodiment, after the silicon oxide film 61 has been formed, the heat treatment with a heat treatment furnace, and the heat treatment in a plasma atmosphere generated by using $N_2O$ gas or $N_2$ gas are made, whereby the water in the silicon oxide film 61 can be sufficiently removed. Because the water in the silicon oxide film 61 has been sufficiently removed, a large amount of water is not released from the silicon oxide film 61 via the contact holes 68. A large amount of water is not released from the silicon oxide film 61 when the conductor plugs 70 are buried in the contact holes, which permits the raw material gas forming the conductor plugs 70 to sufficiently arrive at the insides of the contact holes 68. Thus, according to the present embodiment, the conductor plugs 70 can be surely buried in the contact-holes 68, and a semiconductor device of high reliability can be provided.

The heat treatment in a plasma atmosphere generated by using $N_2O$ gas or $N_2$ gas follows the heat treatment with a heat treatment furnace here. However, the heat treatment may follow the heat treatment in a plasma atmosphere generated by using $N_2O$ gas or $N_2$ gas.

However, in view of removing the water in the silicon oxide film 61 in a larger amount, the heat treatment in a plasma atmosphere generated by using $N_2O$ gas or $N_2$ gas following the heat treatment with a heat treatment furnace is preferable to the heat treatment with a heat treatment furnace following the heat treatment in a plasma atmosphere generated by using $N_2O$ gas or $N_2$ gas.

Then, the barrier film 62 is formed on the silicon oxide film 61 by, e.g., sputtering or CVD. The barrier film 62 is, e.g., a 20–70 nm-thickness aluminum oxide film. The barrier film 62 is a 50 nm-thickness aluminum oxide film here. The barrier film 62, which has been formed on the planarized silicon oxide film 61, is flat.

Figure 11A:
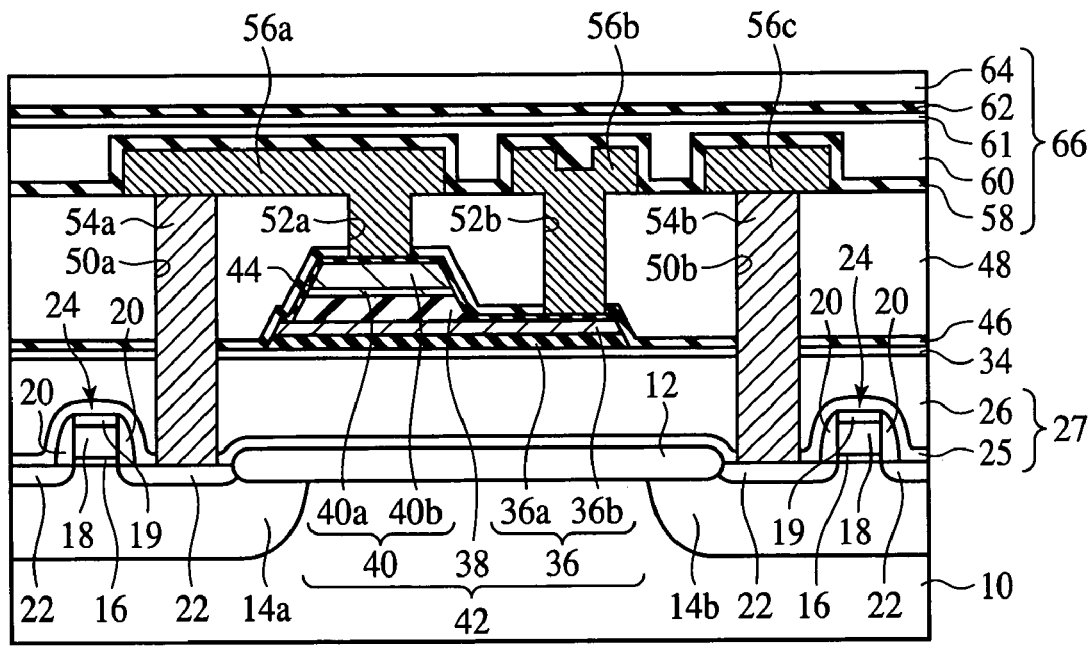
FIGS. 11A and 11B are sectional views of the semiconductor device according to the embodiment of the present invention in the steps of the method for fabricating the semiconductor device, which illustrate the method (Part 8).

Then, the 100 nm-thickness silicon oxide film 64, for example, is formed on the entire surface by, e.g., plasma TEOSCVD (see FIG. 11A). The radiofrequency power applied between the electrodes to generate the plasma is, e.g., 200 W. The silicon oxide film 64 is for preventing the barrier film 62 from being etched when the conduction film is patterned to form the interconnections 72a, 72b.

Then, the semiconductor substrate 10 is loaded into a heat treatment furnace to make the heat treatment. The heat treatment is for removing the water in the silicon oxide film 64. The gas fed into the heat treatment furnace for the heat treatment is, e.g., $N_2O$ gas or $N_2$ gas. The flow rate of the $N_2O$ gas or $N_2$ gas fed into the heat treatment furnace is, e.g., 10000–20000 sccm. The pressure in the heat treatment furnace is, e.g., atmospheric pressure. The substrate temperature for the heat treatment is, e.g., 350–650° C. The heat treatment period of time is, e.g., 30–120 minutes.

Next, the heat treatment in a plasma atmosphere generated by using $N_2O$ gas or $N_2$ gas is made. The heat treatment removes the water in the silicon oxide film 64 and modifies the film quality of the silicon oxide film 64 to make it difficult for water to enter the silicon oxide film 64. The heat treatment nitrides the surface of the silicon oxide film 64 and forms SiON film (not illustrated) on the surface of the silicon oxide film 64. The substrate temperature for the heat treatment is, e.g., 350–400° C. The heat treatment period of time, is, e.g., 2–4 minutes. The flow rate of the $N_2O$ gas or the $N_2$ gas is, e.g., about 350 sccm.

According to the present embodiment, after the silicon oxide film 64 has been planarized, the heat treatment with a heat treatment furnace, and the heat treatment in a plasma atmosphere generated by using $N_2O$ gas or $N_2$ gas are made, whereby the water in the silicon oxide film 64 can sufficiently removed. Because the water in the silicon oxide film 64 has been sufficiently removed, a large amount of water is not released, via the contact holes 68 from the silicon oxide film 64 when the conductor plugs 70 are buried in the contact holes 68. When the conductor plugs 70 are buried in the contact holes 68, a large amount of water is not released from the silicon oxide film 64, which allows the raw material gas forming the conductor plugs 70 to sufficiently arrive at the insides of the contact holes 68. Thus, according to the present embodiment, the conductor plugs 70 can be surely buried in the contact holes 68, and a semiconductor device of high reliability can be provided.

The heat treatment in a plasma atmosphere generated by using $N_2O$ gas or $N_2$ gas follows the heat treatment with a heat treatment furnace here. The heat treatment with a heat treatment furnace may follow the heat treatment in a plasma atmosphere generated by using $N_2O$ gas or $N_2$ gas.

However, in view of removing the water in the silicon oxide film 64 in a larger amount, the heat treatment in a plasma atmosphere generated by using $N_2O$ gas or $N_2$ gas following the heat treatment with a heat treatment furnace is preferable to the heat treatment with a heat treatment furnace following the heat treatment in a plasma atmosphere generated by using $N_2O$ gas or $N_2$ gas.

Thus, the barrier film 58, the silicon oxide film 60, the silicon oxide film 61, the barrier film 62 and the silicon oxide film 64 form the inter-layer insulation film 66.

Figure 11B:
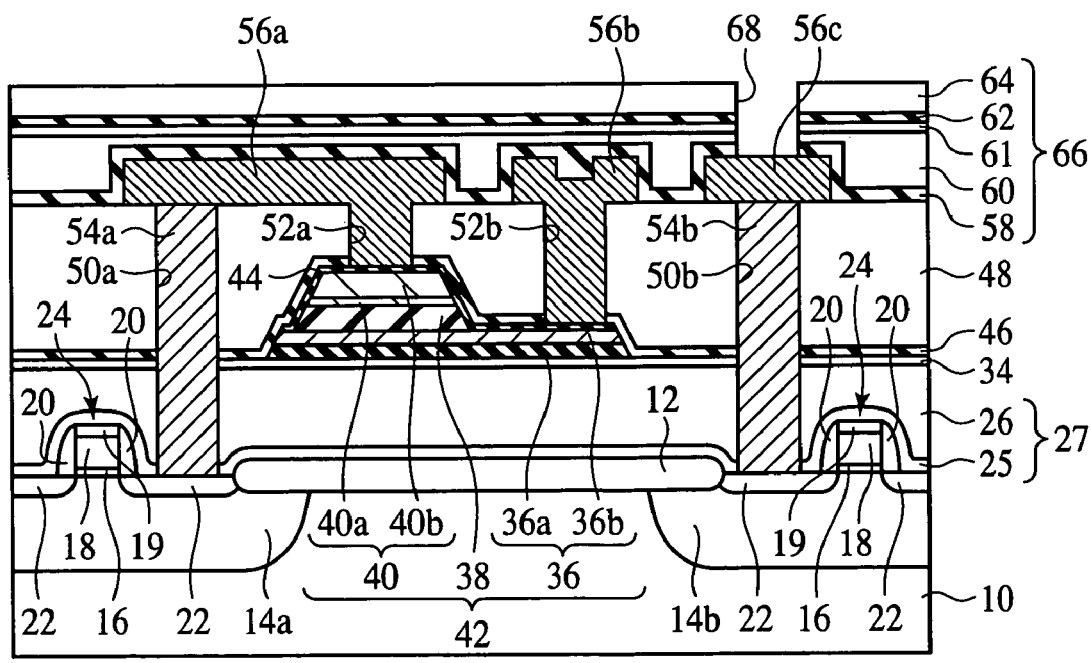
Figure 12A:
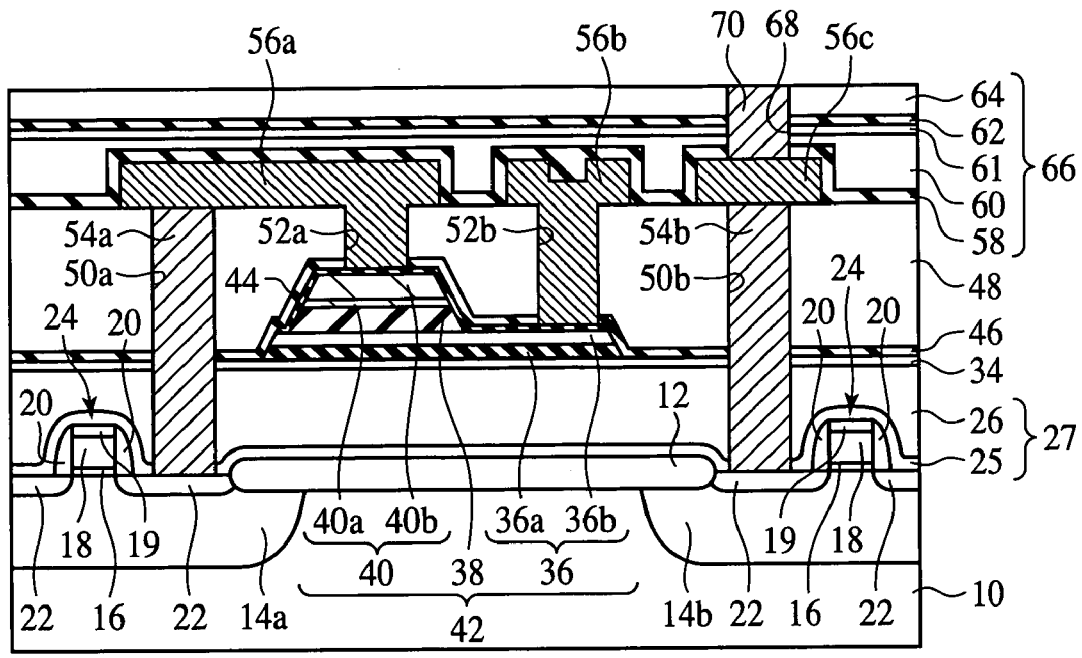
FIGS. 12A and 12B are sectional views of the semiconductor device according to the embodiment of the present invention in the steps of the method for fabricating the semiconductor device, which illustrate the method (Part 9).
Figure 12B:
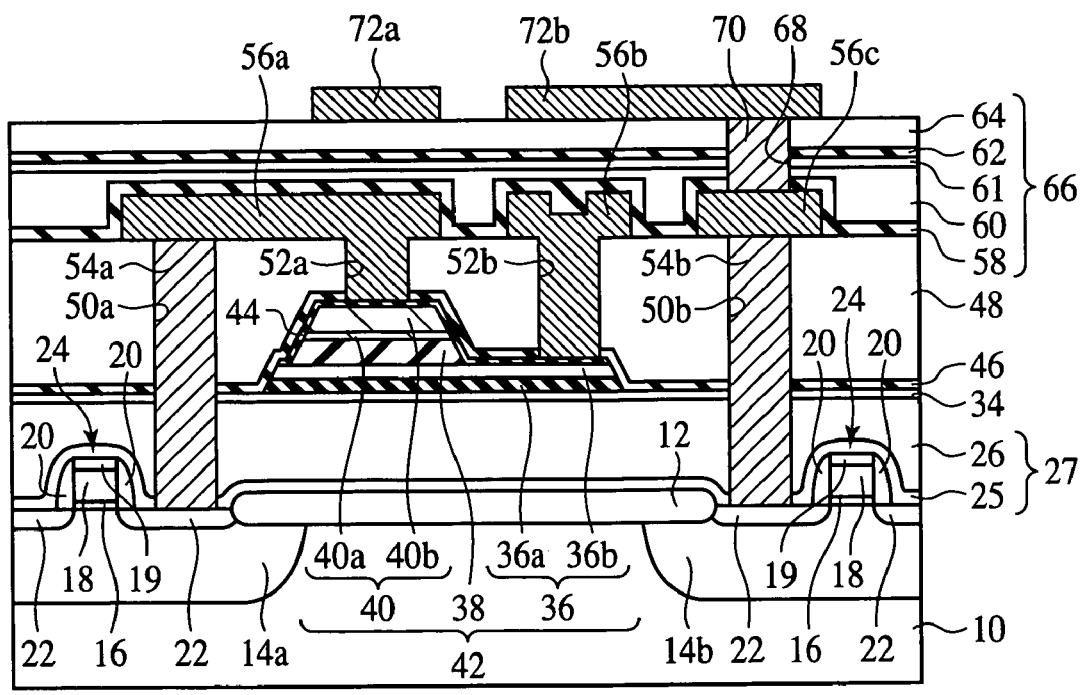

Then, by photolithography and dry etching, the contact holes 68 are formed in the inter-layer insulation film 66 down to the interconnections 56c (see FIG. 11B).

Next, the heat treatment is made, e.g., at 350° C. for 120 minutes in an $N_2$ atmosphere.

Then, the 50 nm-thickness TiN film, for example, is formed on the entire surface by, e.g., sputtering. Thus, the barrier metal (not illustrated) of the TiN film is formed.

Then, the 500 nm-thickness tungsten film, for example, is formed on the entire surface by, e.g., CVD. The raw material gas is, e.g., $WF_6$ gas. The flow rate of the raw material gas is, e.g., 10 sccm. The film forming temperature is, e.g., 300–500° C. When the conductor plugs 70 are buried in the contact holes 68, a large amount of water is not released from the silicon oxide films 60, 61, 64, from which the water has been sufficiently removed. When the conductor plugs 70 are buried in the contact holes 68a, a large amount of water is not released from the silicon oxide films 60, 61, 64, which permits the raw material gas forming the conductor plugs 70 to sufficiently arrive at the insides of the contact holes 68. Thus, according to the present embodiment, the conductor plugs 70 can be surely buried in the contact holes 68, and a semiconductor device of high reliability can be provided.

Then, the tungsten film is etched back by, e.g., EB (etch back) until the surface of the TiN film is exposed. Thus, the conductor plugs 70 of tungsten are buried in the contact holes 68 (see FIG. 12A).

Then, the 500 nm-thickness AlCu alloy film, for example, the 5 nm-thickness Ti film, for example, and the 150 nm-thickness TiN film, for example, are sequentially laid on the entire surface. Thus, the conduction film of the TiN film, the AlCu alloy film and the Ti film and the TiN film sequentially laid is formed.

Then, the conduction film is patterned by photolithography and dry etching. Thus, the second metal interconnection layer 72, i.e., the interconnections 72a, and the interconnections 72b electrically connected to the conductor plugs 70 are formed (see FIG. 12B).

Figure 13A:
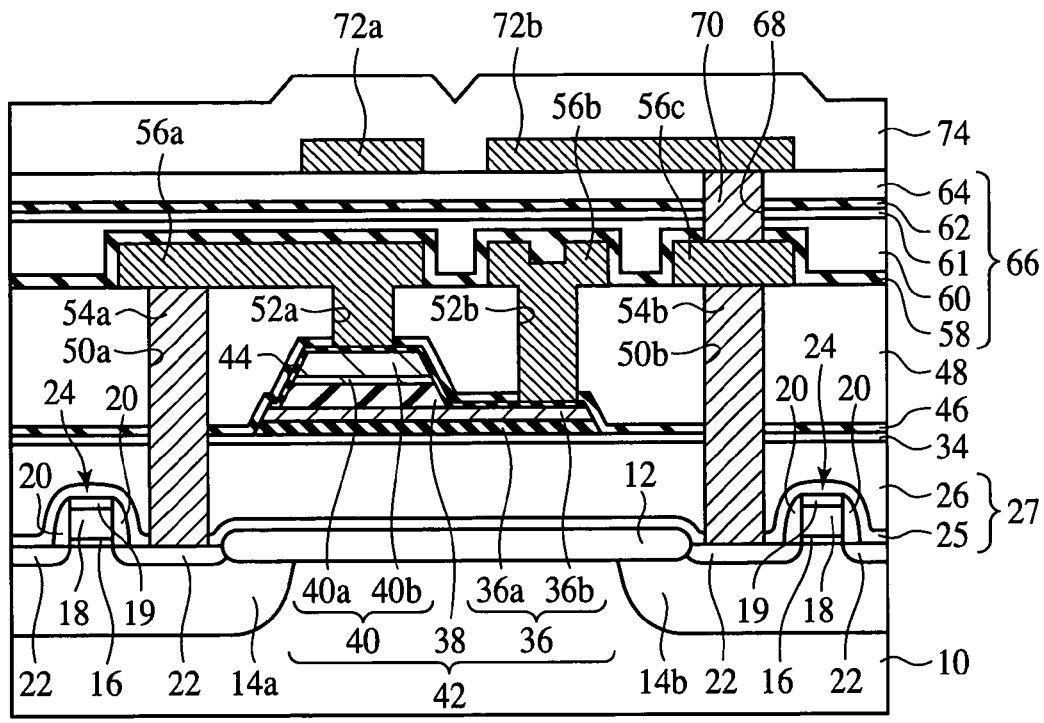
FIGS. 13A and 13B are sectional views of the semiconductor device according to the embodiment of the present invention in the steps of the method for fabricating the semiconductor device, which illustrate the method (Part 10).

Then, the 2200 nm-thickness silicon oxide film 74 is formed on the entire surface by, e.g., plasma TEOSCVD (see FIG. 13A). The radiofrequency power applied between the electrodes for generating the plasma is, e.g., 200 W.

Figure 13B:
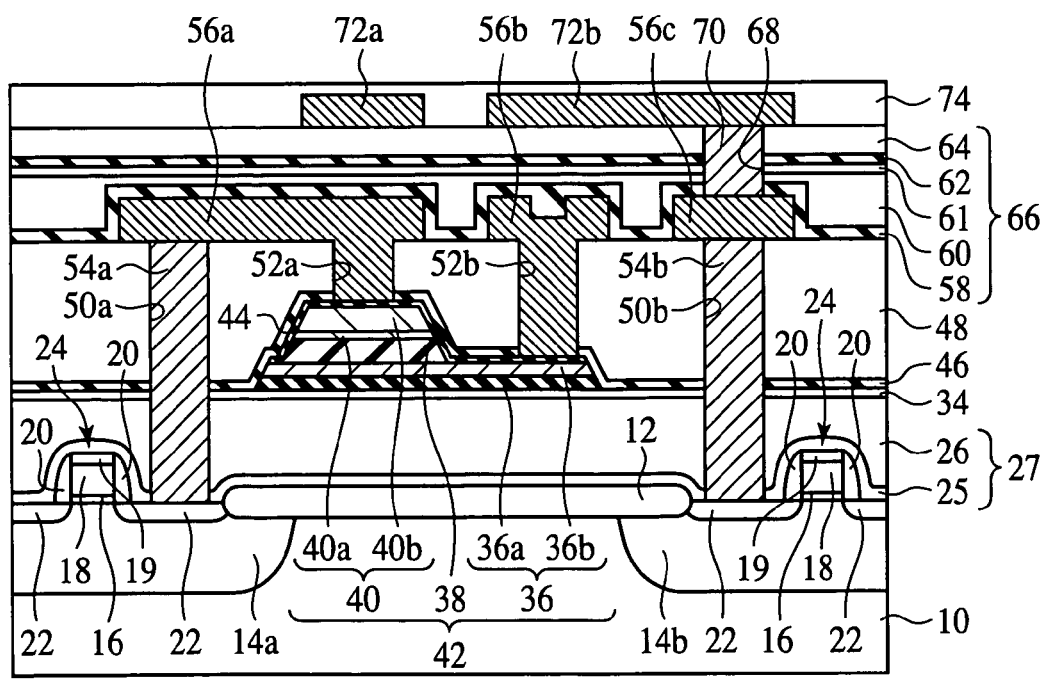

Next, the surface of the silicon oxide film 74 is planarized by, e.g., CMP (see FIG. 13B).

Next, the semiconductor substrate 10 is loaded into a heat treatment furnace to make the heat treatment. The heat treatment is for removing the water in the silicon oxide-film 74. The gas fed into the heat treatment furnace for the heat treatment is, e.g., $N_2O$ gas or $N_2$ gas. The flow rate of the $N_2O$ gas or $N_2$ gas fed into the heat treatment furnace is, e.g., 10000–20000 sccm. The pressure in the heat treatment furnace is, e.g., the atmospheric pressure. The substrate temperature for the heat treatment is, e.g., 350–650° C. The heat treatment period of time is, e.g., 30–120 minutes.

Then, the heat treatment is made in a plasma atmosphere generated by using $N_2O$ gas or $N_2$ gas. The heat treatment is for removing the water in the silicon oxide film 74 and modifying the film quality of the silicon oxide film 74 to make it difficult for water to enter the silicon oxide film 74. The heat treatment nitrides the surface of the silicon oxide film 74, and SiON film (not illustrated) is formed on the surface of the silicon oxide film 74. The substrate temperature for the heat treatment is, e.g., 350–400° C. The heat treatment period of time, e.g., 2–4 minutes. The flow rate of the $N_2O$ gas or $N_2$ gas is, e.g., about 350 sccm.

After the silicon oxide film 74 has been planarized, the heat treatment with a heat treatment furnace, and the heat treatment in a plasma atmosphere generated by using $N_2O$ gas or $N_2$ gas are made, whereby the water in the silicon oxide film 74 can be sufficiently removed. A large amount of water is not released, via the contact holes 84a, 84b, from the silicon oxide film 74, from which the water has been sufficiently removed, when the conductor plugs 86a, 86b are buried in the contact holes 84a, 84b. When the conductor plugs 86a, 86b are buried in the contact holes 84a, 84b, the water in the silicon oxide film is not released in a large amount via the contact holes 84a, 84b, which permits the raw material gas forming the conductor plugs 86a, 86b to sufficiently arrive at the insides of the contact holes 84a, 84b. Thus, according to the present embodiment, the conductor plugs 86a, 86b can be surely buried in the contact holes 84a, 84b, and a semiconductor device of high reliability can be provided.

The heat treatment in a plasma atmosphere generated by using $N_2O$ gas or $N_2$ gas follows the heat treatment here. However, the heat treatment with a heat treatment furnace may follow the heat treatment in a plasma atmosphere generated by using $N_2O$ gas or $N_2$ gas.

However, in view of removing a larger amount of the water in the silicon oxide film 74, the heat treatment in a plasma atmosphere generated by using $N_2O$ gas or $N_2$ gas following the heat treatment with a heat treatment furnace is preferable to the heat treatment with a heat treatment furnace following the heat treatment in a plasma atmosphere generated by using $N_2O$ gas or $N_2$ gas.

Next, the 100 nm-thickness silicon oxide film 76, for example, is formed on the entire surface by, e.g., plasma TEOSCVD. The radiofrequency power applied between the electrodes for generating the plasma is, e.g., 200 W. The silicon oxide film 76, which is formed on the planarized silicon oxide film 74, is flat.

Next, the semiconductor substrate 10 is loaded in the heat treatment furnace to make the heat treatment. The heat treatment is for removing the water in the silicon oxide film 76. The gas fed into the heat treatment for the heat treatment is, e.g., $N_2O$ gas or $N_2$ gas. The flow rate of the $N_2O$ gas or $N_2$ gas fed into the heat treatment furnace is, e.g., 10000–20000 sccm. The pressure in the heat treatment furnace is, e.g., atmospheric pressure the substrate temperature for the heat treatment is, e.g., 350–650° C. The heat treatment period of time is, e.g., 30–120 minutes.

Then, the heat treatment is made in a plasma atmosphere generated by using $N_2O$ gas or $N_2$ gas. The heat treatment is for further removing the water in the silicon oxide film 76 and modifies the film quality of the silicon oxide film 76 to make it difficult for water to enter the silicon oxide film 76. The heat treatment nitrides the surface of the silicon oxide film 76, and SiON film (not illustrated) is formed on the surface of the silicon oxide film 76. The substrate temperature for the heat treatment is, e.g., 350–400° C. The heat treatment period of time is, e.g., 2–4 minutes. The flow rate of the $N_2O$ gas or $N_2$ gas is, e.g., about 350 sccm.

After the silicon oxide film 76 has been formed, the heat treatment with a heat treatment furnace, the heat treatment with a heat treatment furnace, and the heat treatment in a plasma atmosphere generated by using $N_2O$ gas or $N_2$ gas is made, whereby the water in the silicon oxide film 76 can be sufficiently removed. A large amount of water is not released, via the contact holes 84a, 84b from the silicon oxide film 76, from which the water has been sufficiently removed, when the conductor plugs 86a, 86b are buried in the contact holes 84a, 84b, A large amount of water is not released from the silicon oxide film 76 via the contact holes 84a, 84b, which permits the raw material gas to sufficiently arrive at the insides of the contact holes 84a, 84b when the conductor plugs 86a, 86b are buried in the contact holes 84a, 84b. Thus, according to the present embodiment, the conductor plugs 86a, 86b can be surely buried in the contact holes 84a, 84b, and a semiconductor device of high reliability can be provided.

The heat treatment in a plasma of $N_2O$ gas or $N_2$ gas follows the heat treatment in a heat treatment furnace here, but the heat treatment with heat treatment furnace may follow the heat treatment in a plasma atmosphere generated by using $N_2O$ gas or $N_2$ gas.

However, in view of removing a larger amount of water from the silicon oxide film 76, the heat treatment in a plasma atmosphere generated by using $N_2O$ or $N_2$ gas following the heat treatment with a heat treatment furnace is preferable to the heat treatment with a heat treatment furnace following the heat treatment in a plasma atmosphere generated by using $N_2O$ gas or $N_2$ gas.

Then, on the silicon oxide film 76, the barrier film 78 is formed by, e.g., sputtering or CVD. The barrier film 78 is, e.g., a 20–70 nm-thickness aluminum oxide film, for example. The barrier film 78 is a 50 nm-thickness aluminum oxide film here. The barrier film 78, which is formed on the flat silicon oxide film 76, is flat.

Figure 14A:
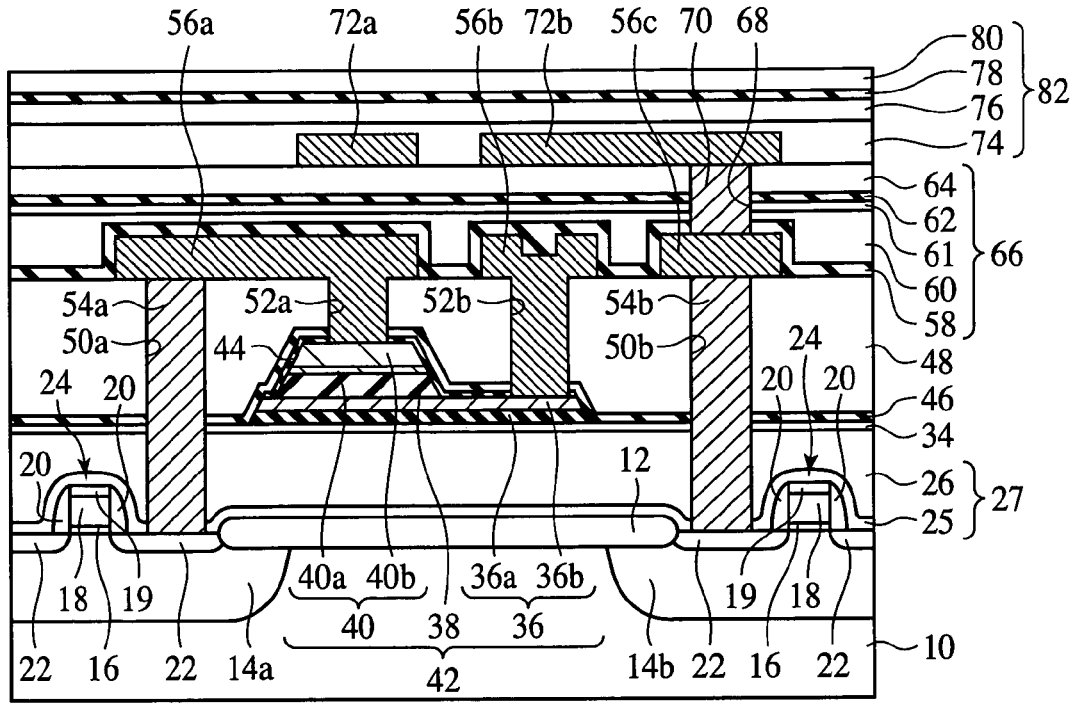
FIGS. 14A and 14B are sectional views of the semiconductor device according to the embodiment of the present invention in the steps of the method for fabricating the semiconductor device, which illustrate the method (Part 11).

Next, the 100 nm-thickness silicon oxide film 80, for example, is formed on the entire surface by, e.g., plasma TEOSCVD (see FIG. 14A). The radiofrequency power applied between the electrodes for generating the plasma is, e.g., 200 W.

Next, the semiconductor substrate 10 is loaded into the heat treatment furnace to make the heat treatment. The heat treatment is for removing the water in the silicon oxide film 80. The gas fed into the heat treatment furnace for the heat treatment is, e.g., $N_2O$ gas or $N_2$ gas. The flow rate of the $N_2O$ gas or $N_2$ gas fed into the heat treatment furnace is, e.g., 10000–20000 sccm. The pressure for the heat treatment is, e.g., the atmospheric pressure. The substrate temperature for the heat treatment is, e.g., 350–650° C. The heat treatment period of time is, e.g., 30–120 minutes.

Next, the heat treatment in a plasma atmosphere generated by using $N_2O$ gas or $N_2$ gas is made. The heat treatment is for further removing the water in the silicon oxide film 80 and modifies the film quality of the silicon oxide film 80 to make it difficult for water to enter the silicon oxide film 80. The heat treatment nitrides the surface of the silicon oxide film 80, and SiON film (not illustrated) is formed on the surface of the silicon oxide film. The substrate temperature for the heat treatment is, e.g., 350–400° C. The heat treatment period of time is, e.g., 2–4 minutes. The flow rate of the $N_2O$ gas or $N_2$ gas is, e.g., about 350 sccm.

After the silicon oxide film 80 has been formed, the heat treatment with a heat treatment furnace, and the heat treatment in a plasma atmosphere generated by using $N_2O$ gas or $N_2$ gas are made, whereby the water in the silicon oxide film 80 can be sufficiently removed. A large amount of water is not released, via the contact holes 84a, 84b from the silicon oxide film 80, from which the water has been sufficiently removed, when the conductor plugs 84a, 84b are buried in the contact holes 84a, 84b, When the conductor plugs 86a, 86b are buried in the contact holes 84a, 84b, a large amount of water is not released from the silicon oxide film 80 via the contact holes 84a, 84b, which permits the raw material gas forming the conductor plugs 96a, 96b to sufficiently arrive at the insides fo the contact holes 84a, 84b. Thus, according to the present embodiment, the conductor plugs 86a, 86b are surely buried in the contact holes 84a, 84b, and a semiconductor device of high reliability can be provided.

The heat treatment in a plasma atmosphere generated by using $N_2O$ gas or $N_2$ gas follows the heat treatment with a heat treatment furnace here. The heat treatment with a heat treatment furnace may follow the heat treatment in a plasma atmosphere generated by using $N_2O$ gas or $N_2$ gas.

In view of a larger amount of the water in the silicon oxide film 80, the heat treatment in a plasma atmosphere generated by using $N_2O$ gas or $N_2$ gas following the heat treatment with a heat treatment furnace is preferable to the heat treatment with a heat treatment furnace following the heat treatment in a plasma atmosphere generated by using $N_2O$ gas or $N_2$ gas.

Thus, the silicon oxide film 74, the silicon oxide film 76, the barrier film 78 and the silicon oxide film 80 form the inter-layer insulation film 82.

Figure 14B:
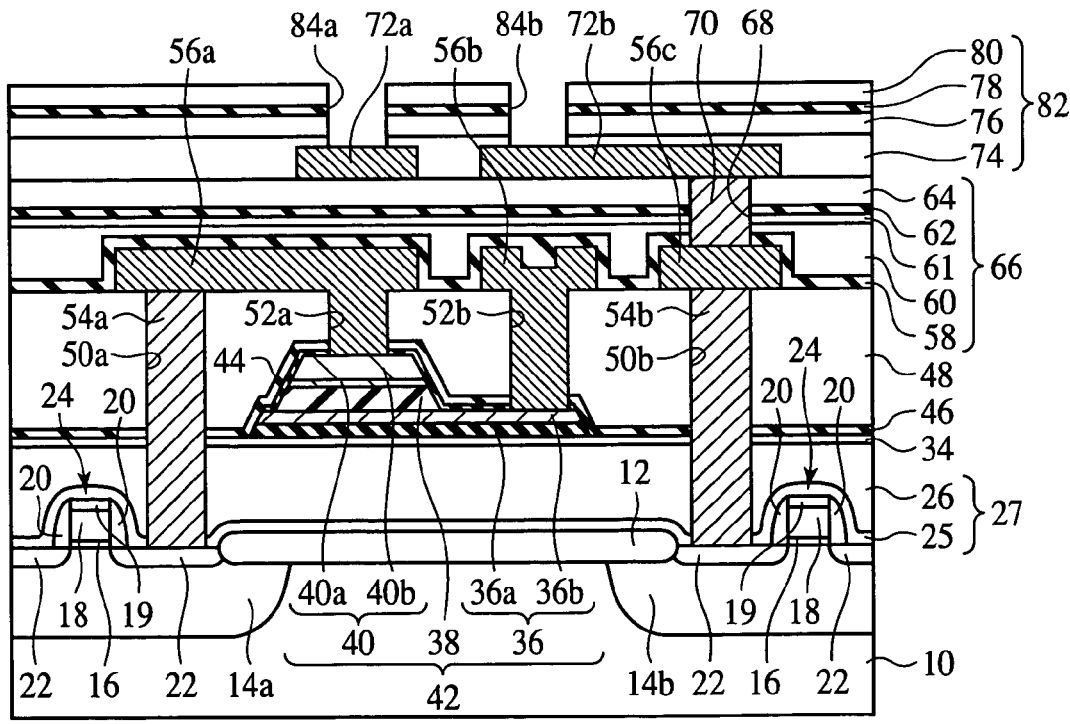
Figure 15A:
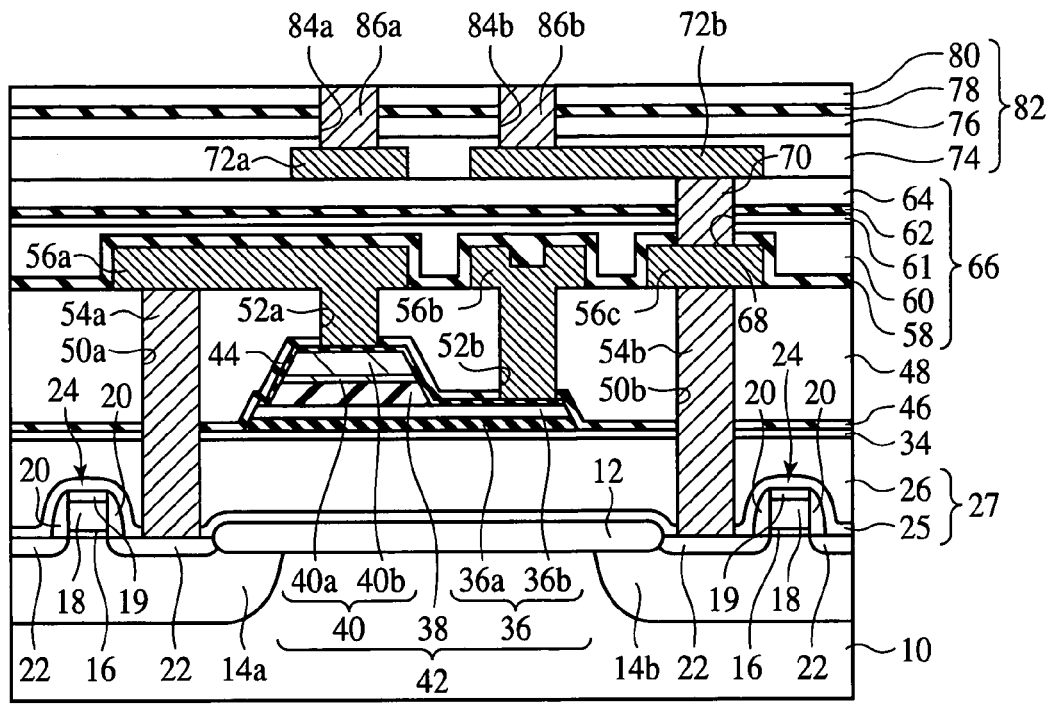
FIGS. 15A and 15*b* are sectional views of the semiconductor device according to the embodiment of the present invention in the steps of the method for fabricating the semiconductor device, which illustrate the method (Part 12).
Figure 15B:
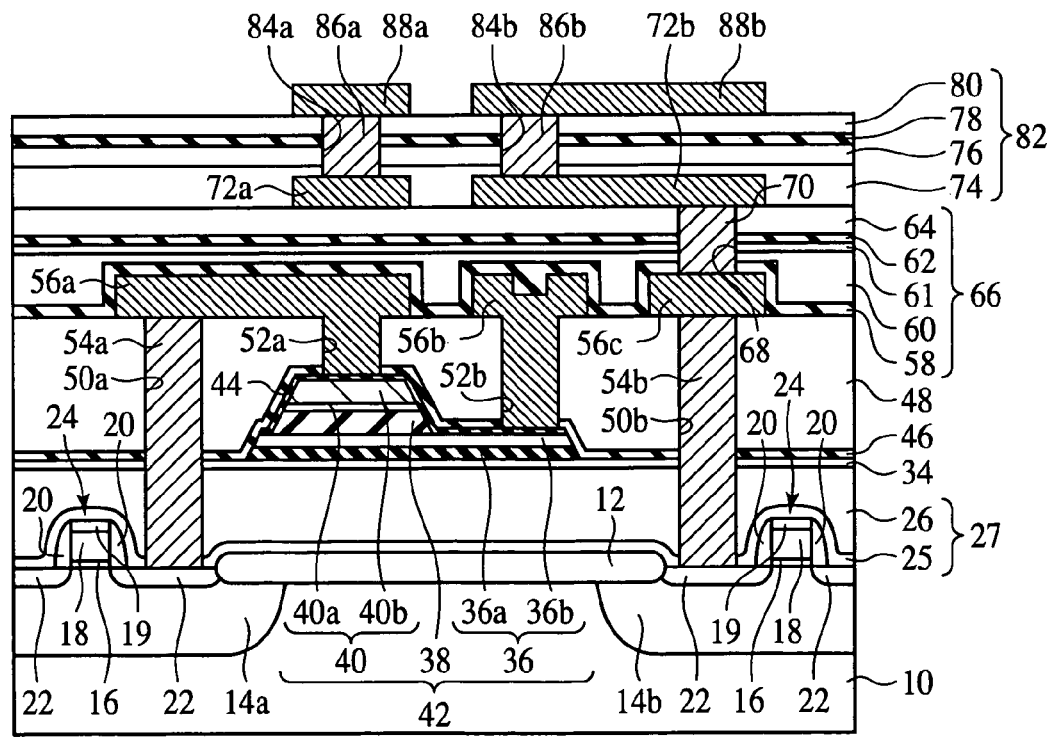

Next, the contact holes 84a, 84b are formed in the inter-layer insulation film 82 down to the interconnections 72a, 72b by photolithography and dry etching (see FIG. 14B)

Next, the heat treatment is made in an Ne atmosphere, e.g., at 350° C. for 120 minutes.

Next, the 50 nm-thickness TiN film, for example, is formed on the entire surface by, e.g., sputtering. Thus, the barrier metal (not illustrated) of the TiN film is formed.

Next, the 500 nm-thickness tungsten film, for example, is formed on the entire surface by, e.g., CVD. The raw material gas is, e.g., WF6 gas. The flow rate of the raw material gas is, e.g., about 10 sccm. The film forming temperature is, e.g., 300–500° C. A large amount of water is not released, via the contact holes 84a, 84b, from the silicon oxide films 74, 76, 80, from which the water has been sufficiently removed, when the conductor plugs 86a, 86b are buried in the contact holes 84a, 84b. A large amount of water is not released, via the contact holes 84a, 84b, from the silicon oxide films 74, 76, 80 when the conductor plugs 86a, 86b are buried in the contact holes 84a, 84b, which permits the raw material gas forming the conductor plugs 86a, 86b to sufficiently arrive at the insides of the contact holes 84a, 84b. Thus, according to the present embodiment, the conductor plugs 86a, 86b can be surely buried in the contact holes 84a, 84b, and a semiconductor device of high reliability can be provided.

Then, the tungsten film is etched backed by, e.g., EB (etch back) until the surface of the TiN film is exposed. Thus, the conductor plugs 85a, 86b of the tungsten are buried respectively in the contact holes 84a, 84b (see FIG. 15A).

Then, the 500 nm-thickness AlCu alloy film, for example, and the 150 nm-thickness TiN film, for example, are sequentially laid. Thus, the conduction film of the TiN film, the AlCu alloy film and the TiN film sequentially laid is formed.

Then, the conduction film is patterned by photolithography and dry etching. Thus, the interconnections 88a electrically connected to the third metal interconnection layer 88, i.e., the conduction plugs 86a are formed. The interconnections 88b electrically connected to the conductor plugs 88b are also formed (see FIG. 15B).

Next, the 100 nm-thickness silicon oxide film 90, for example, is formed on the entire surface b, e.g., plasma TEOSCVD.

Next, the heat treatment is made in a plasma atmosphere generated by using $N_2O$ gas or $N_2$ gas, e.g., at 350° C. for 2 minutes. The heat treatment removes the water in the silicon oxide film 90 and modifies the film quality of the silicon oxide film 90 to make it difficult for water to enter the silicon oxide film 90. The heat treatment nitrides the surface of the silicon oxide film 90, an SiON film of the silicon oxide film 90 (not illustrated) is formed.

Figure 16A:
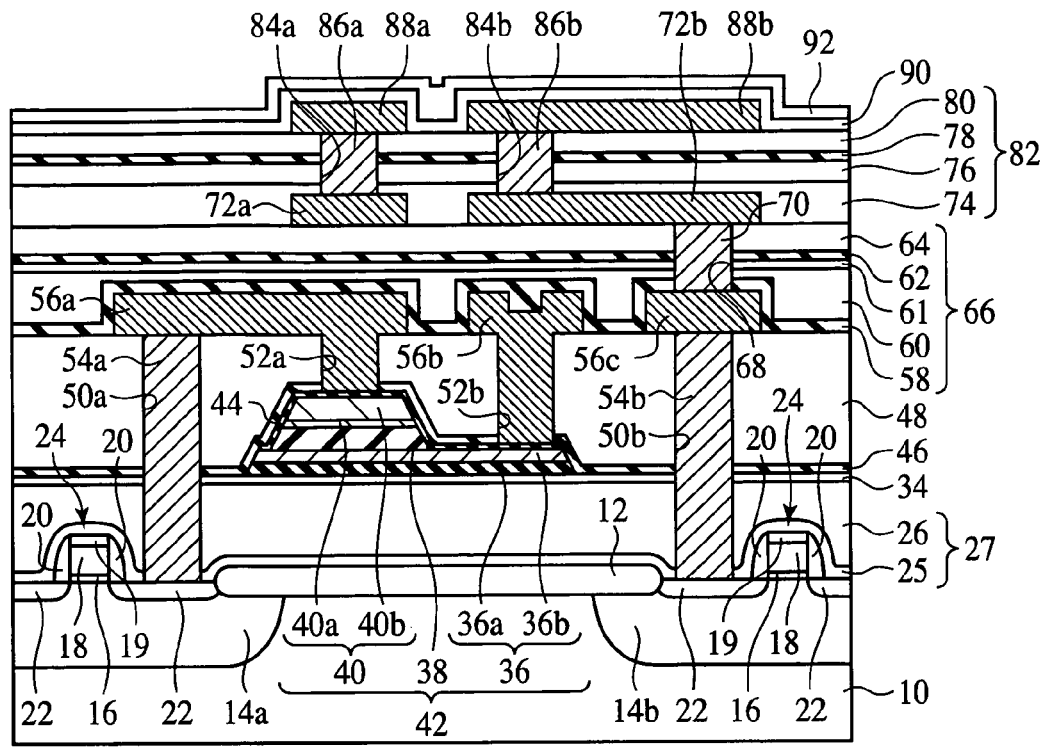
FIGS. 16A and 16B are sectional views of the semiconductor device according to the embodiment of the present invention in the steps of the method for fabricating the semiconductor device, which illustrate the method (Part 13).
Figure 16B:
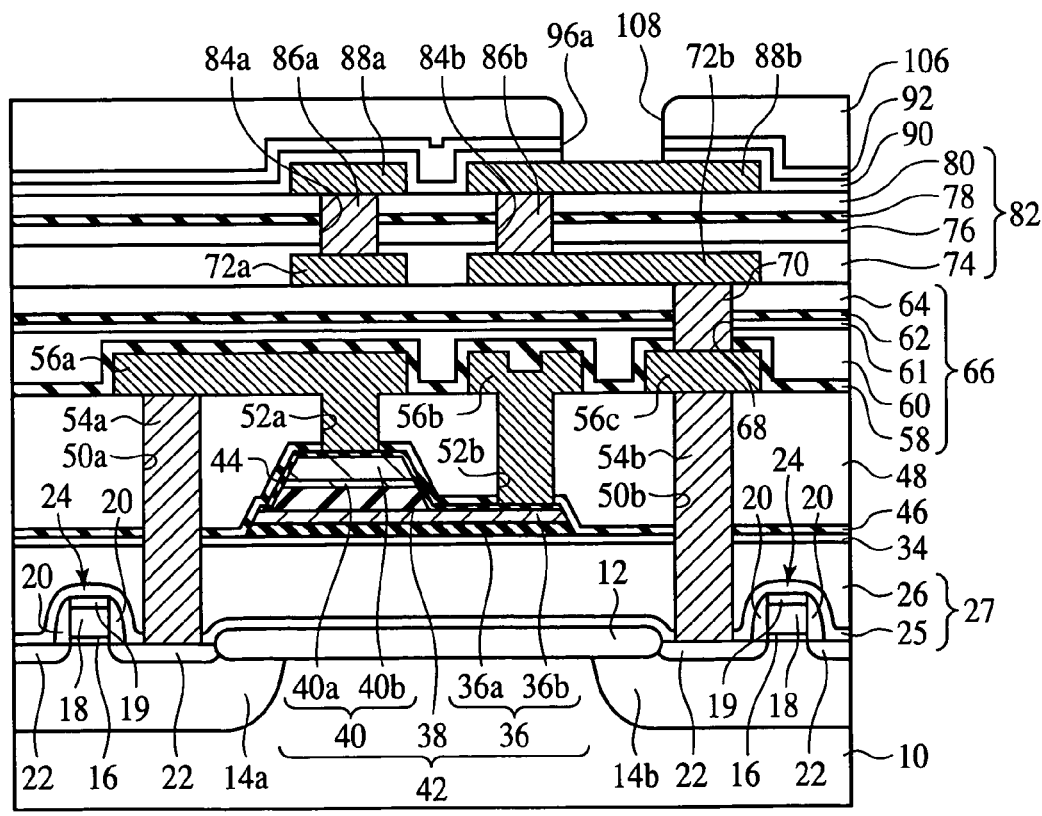

Next, the 350 nm-thickness silicon nitride film 92, for example, is formed by, e.g., CVD (see FIG. 16A). The silicon nitride film 92 blocks water to thereby keep the metal interconnection layers 88, 72, 56, etc. from being corroded with water.

Next, a photoresist film 106 is formed on the entire surface by, e.g., spin coating.

Next, by photolithography, the openings 108 are formed in the photoresist film 106, for exposing the regions where the openings are to be formed in the silicon nitride film 92 and the silicon oxide film 90 down to the interconnections (bonding pads) 88b.

Then, with the photoresist film 106 as the mask, the silicon nitride film 92 and the silicon oxide film 90 are etched. Thus, the openings 96a are formed in the silicon nitride film 92 and the silicon oxide film 90 down to the interconnections (bonding pads) 88b (see FIG. 16B). Then, the photoresist film 106 is released.

Figure 17A:
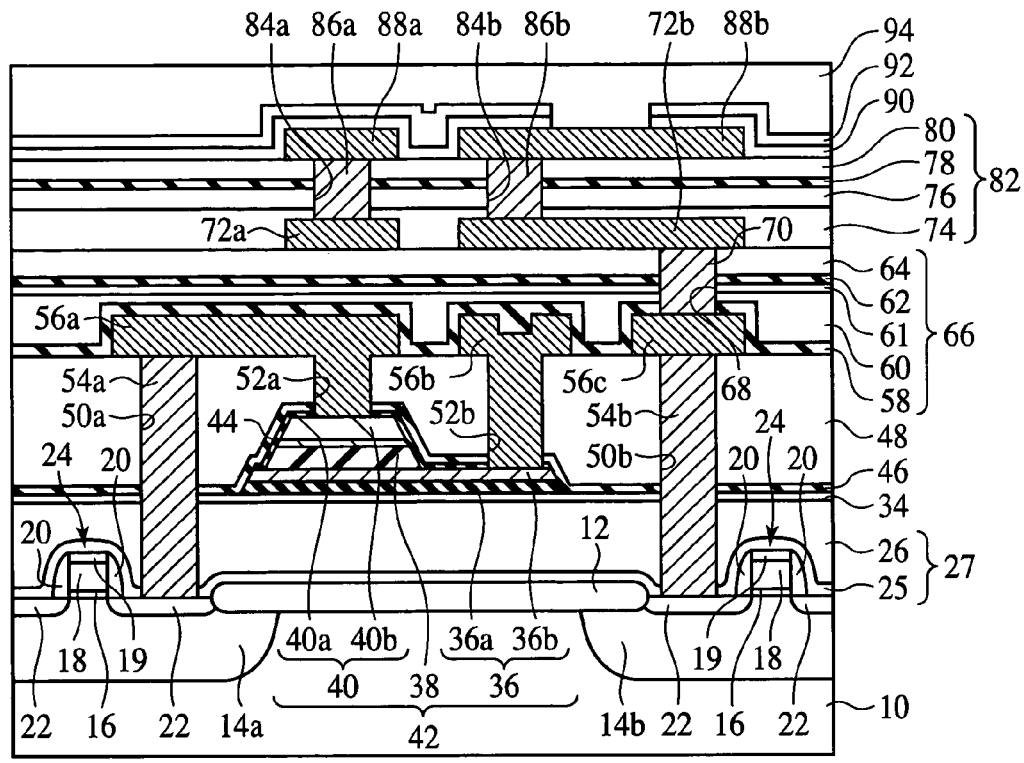
FIGS. 17A and 17B are sectional views of the semiconductor device according to the embodiment of the present invention in the steps of the method for fabricating the semiconductor device, which illustrate the method (Part 14).

Then, the 2–6 μm-thickness polyimide resin 94 is formed by, e.g., spin coating (see FIG. 17A).

Figure 17B:
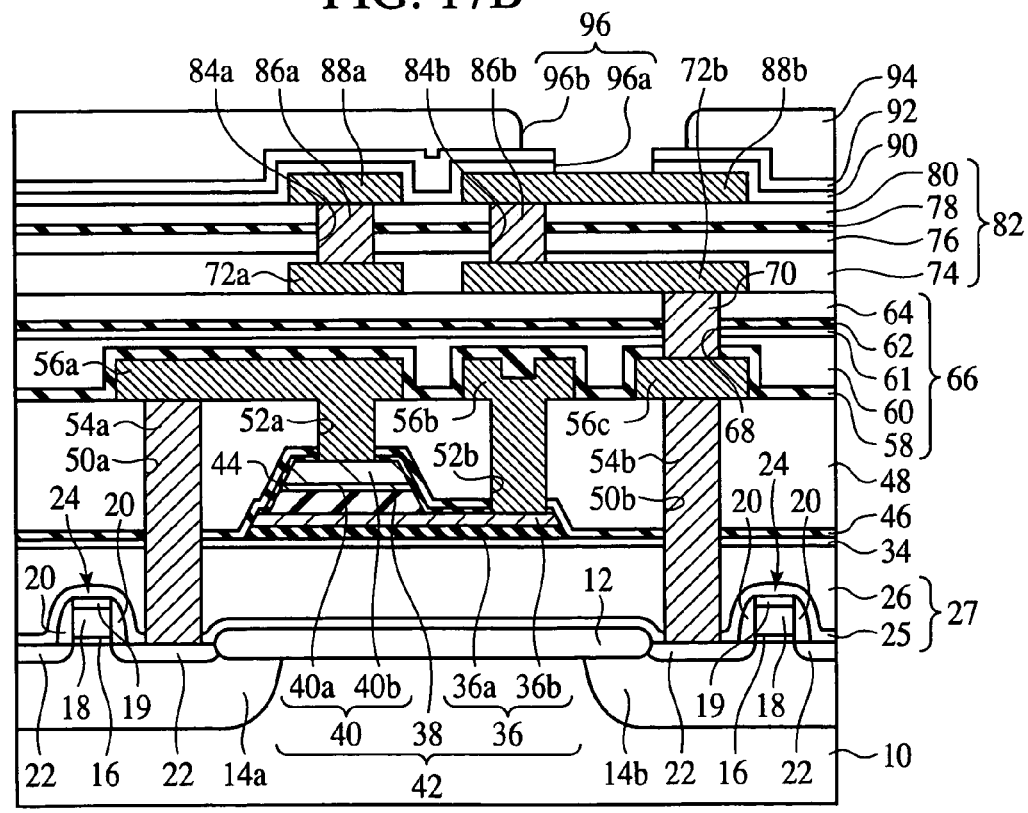

Next, by photolithography, the openings 96b are formed in the polyimide resin 94 down to the interconnections (bonding pads) 88b (se FIG. 17B).

Thus, the semiconductor device according to the present embodiment is fabricated.

The method for fabricating a semiconductor device according to the present embodiment is characterized mainly in that after an insulation film has been formed, the heat treatment with a heat treatment furnace, and the heat treatment in a plasma atmosphere generated by using $N_2O$ gas or $N_2$ gas are made. According to the present embodiment, after an insulation film has been formed, the heat treatment with a heat treatment furnace, and the heat treatment in a plasma atmosphere generated by using $N_2O$ gas or $N_2$ gas are made, whereby the water in the insulation film can be sufficiently removed. Accordingly, even when a flat barrier film is formed on the insulation film, a large amount of water is not released via the contact holes when the conductor plugs are formed. When the conductor plugs are buried in the contact holes, a large amount of water is not released from the insulation film via the contact holes, which allows the raw material gas forming the conductor plugs to sufficiently arrive at the insides of the contact holes. Thus, according to the present embodiment, the conductor plugs can be surely buried in the contact holes, and a semiconductor device of high reliability can be provided.

MODIFIED EMBODIMENTS

The present invention is not limited to the above-described embodiment and can cover other various modifications.

For example, in the above-described embodiment, the ferroelectric film 38 is PZT film. However, the ferroelectric film 38 is not essentially PZT film and can be suitably any other ferroelectric film. For example, the ferroelectric film 38 may be $Pb_{1-x}La_xZr_{1-y}Ti_yO_3$ film (PLZT film), $SrBi_2(Ta_xNb_{1-x})_2O_9$ film, $Bi_4Ti_2O_{12}$ film or others.

In the above-described embodiment, the lower electrodes 36 are formed of the layer film of the aluminum oxide film 36a and the Pt film 36b sequentially laid. However, the material of the conduction film, etc. forming the lower electrodes 36 is not limited to the material. For example, the lower electrodes 38 may be formed of, e.g., Ir (iridium) film, $IrO_2$ film, Ru (ruthenium) film, $RuO_2$ film, SrRuO (strontium ruthenium oxide) film (SRO film) or Pd film.

In the above-described embodiment, the upper electrodes 40 are formed of the layer film of an $IrO_X$ film 40a and an $IrO_Y$ film 40b. However, the material of the conduction film forming the upper electrodes 40 is not limited to the material. For example, the upper electrodes 40 may be formed of Ir film, Ru film, $RuO_2$ film, SRO film or Pd film.

In the above-described embodiment, the flat barrier film 62 is formed between the first metal interconnection layer 56 and the second metal interconnection layer 72, and the flat barrier film 78 is formed between the second metal interconnection layer 72 and the third metal interconnection layer 88. However, the flat barrier film 62 may be formed only between the first metal interconnection layer 56 and the second metal interconnection layer 72, or the flat barrier film 78 may be formed only between the second metal interconnection layer 72 and the third metal interconnection layer 88.

More flat barrier films may be formed corresponding to a layer number of the metal interconnection layer formed on the semiconductor substrate 10.

In the above-described embodiment, the barrier films are formed of aluminum oxide film. However, the barrier films are not essentially aluminum oxide film. Films having the function of preventing the diffusion of hydrogen water can be suitably used. Films of, e.g., metal oxides can be suitably used as the barrier films. The barrier films of metal oxides can be formed of, e.g., tantalum oxide, titanium oxide, etc. The barrier films may not be formed essentially of metal oxides. For example, the barrier films may be formed of silicon nitride film ($Si_3N_4$ film), silicon nitride oxide film (SiON film), etc. Coated-type oxide films, or hydroscopic organic films, such as polyamide, polyallylene, polyallylene ether, benzocyclobutne, etc., can be used as the barrier films.

In the above-described embodiment, all the barrier films are formed of the same material. However, as will be described later, the barrier films may be formed suitably of different materials. For example, the barrier film 62 is aluminum oxide film, and the barrier film 78 may be silicon nitride film.

In the above-described embodiment, the insulation films 60, 61, 64, 74, 76, 80 are silicon oxide film but are not essentially silicon oxide film. The insulation films 60, 61, 64, 74, 76, 80 may be, e.g., impurity-content silicon oxide film or others.

In the above-described embodiment, the insulation films 26, 48, 60, 74 are planarized by CMP. The surfaces of the insulation films 26, 48, 60, 74 may not be planarized essentially by CMP. For example, the surfaces of the insulation films 26, 48, 60, 74 may be planarized by etching. The etching gas can be, e.g., Ar gas.

In the above-described embodiment, a circuit is formed of three metal interconnection layers of the first metal interconnection layer 56, the second metal interconnection layer 72 and the third metal interconnection layer 88 on the semiconductor substrate 10. The metal interconnection layers forming a circuit on the semiconductor substrate 10 is not essentially three metal interconnection layers. A layer number of the metal interconnection layers can be suitably set in accordance with as design of a circuit to be formed on the semiconductor substrate.

In the above-described embodiment, 1T1C type memory cells each including one transistor 24 and one ferroelectric capacitor 24 are formed. However, the constitution of the memory cells is not essentially 1T1C type. The memory cells can be, e.g., 2T2C type including two transistors and two ferroelectric capacitors or another type other than 1T1C type.

In the above-described embodiment, the memory cells are the planar structure. However, the memory cells may be the stacked structure.

What is claimed is:

1. A semiconductor device fabrication method comprising the steps of:
    forming over a semiconductor substrate a ferroelectric capacitor including a lower electrode, a ferroelectric film formed over the lower electrode, and a upper electrode formed over the ferroelectric film;
    forming a first insulation film over the semiconductor substrate and the ferroelectric capacitor;
    forming a first interconnection over the first insulation film;
    forming a second insulation film over the first insulation film and the first interconnection;
    planarizing a surface of the second insulation film;
    making heat treatment with a heat treatment furnace to remove water from the second insulation film;
    making heat treatment in a plasma atmosphere generated by using $N_2O$ gas or $N_2$ gas to remove water from the second insulation film and nitride the surface of the second insulation film;
    forming over the second insulation film a first flat barrier film for preventing the diffusion of hydrogen or water;
    forming a first contact hole in the first barrier film and the second insulation film down to the first interconnection; and
    burying a first conductor plug in the first contact hole.

2. A semiconductor device fabrication method according to claim 1, wherein
    the heat treatment in a plasma atmosphere follows the heat treatment with the heat treatment furnace.

3. A semiconductor device fabrication method according to claim 2, wherein
    in the step of burying conductor plug, the conductor plug of tungsten is buried by CVD.

4. A semiconductor device fabrication method according to claim 2, wherein
    the first barrier film is formed of aluminum oxide, titanium oxide or tantalum oxide.

5. A semiconductor device fabrication method according to claim 2, wherein
    in the step of making heat treatment with the heat treatment furnace, the heat treatment is made with $N_2O$ gas or $N_2$ gas being fed into the heat treatment furnace.

6. A semiconductor device fabrication method according to claim 2, wherein
    a heat treatment temperature in the step of making heat treatment with the heat treatment furnace is 350–650° C.

7. A semiconductor device fabrication method according to claim 2, wherein a heat treatment period of time in the step of making heat treatment with the heat treatment furnace is 30–120 minutes.

8. A semiconductor device fabrication method according to claim 2, wherein
a heat treatment temperature in the step of making heat treatment in the plasma atmosphere is 350–400° C.

9. A semiconductor device fabrication method according to claim 2, wherein
a heat treatment period of time in the step of making heat treatment in the plasma atmosphere is 2–4 minutes.

10. A semiconductor device fabrication method according to claim 2, further comprising, after the step of burying first conductor plugs, the steps of:
forming a second interconnection on the first barrier film;
forming a third insulation film on the first barrier film and the second interconnection;
planarizing the surface of the third insulation film;
making heat treatment with a heat treatment furnace to remove water from the third insulation film;
making heat treatment in a plasma atmosphere generated by using $N_2O$ gas or $N_2$ gas to remove water from the third insulation film and nitride the surface of the third insulation film;
forming on the third insulation film a fourth flat barrier film for preventing the diffusion of hydrogen or water;
forming a second contact hole in the fourth barrier film and the third insulation film down to the second interconnection; and
burying a second conductor plug in the second contact hole.

11. A semiconductor device fabrication method according to claim 1, wherein
in the step of burying conductor plug, the conductor plug of tungsten is buried by CVD.

12. A semiconductor device fabrication method according to claim 1, wherein
the first barrier film is formed of aluminum oxide, titanium oxide or tantalum oxide.

13. A semiconductor device fabrication method according to claim 1, wherein
in the step of making heat treatment with the heat treatment furnace, the heat treatment is made with $N_2O$ gas or $N_2$ gas being fed into the heat treatment furnace.

14. A semiconductor device fabrication method according to claim 1, wherein
a heat treatment temperature in the step of making heat treatment with the heat treatment furnace is 350–650° C.

15. A semiconductor device fabrication method according to claim 1, wherein
a heat treatment period of time in the step of making heat treatment with the heat treatment furnace is 30–120 minutes.

16. A semiconductor device fabrication method according to claim 1, wherein
a heat treatment temperature in the step of making heat treatment in the plasma atmosphere is 350–400° C.

17. A semiconductor device fabrication method according to claim 1, wherein
a heat treatment period of time in the step of making heat treatment in the plasma atmosphere is 2–4 minutes.

18. A semiconductor device fabrication method according to claim 1, further comprising, after the step of burying first conductor plugs, the steps of:
forming a second interconnection on the first barrier film;
forming a third insulation film on the first barrier film and the second interconnection;
planarizing the surface of the third insulation film;
making heat treatment with a heat treatment furnace to remove water from the third insulation film;
making heat treatment in a plasma atmosphere generated by using $N_2O$ gas or $N_2$ gas to remove water from the third insulation film and nitride the surface of the third insulation film;
forming on the third insulation film a fourth flat barrier film for preventing the diffusion of hydrogen or water;
forming a second contact hole in the fourth barrier film and the third insulation film down to the second interconnection; and
burying a second conductor plug in the second contact hole.

* * * * *